United States Patent
Vorapipat et al.

(10) Patent No.: US 11,368,277 B1
(45) Date of Patent: Jun. 21, 2022

(54) ACCURATE SIGN CHANGE FOR RADIO FREQUENCY TRANSMITTERS

(71) Applicant: Apple Inc., Cupertino, CA (US)

(72) Inventors: Voravit Vorapipat, Santa Clara, CA (US); Morteza Nick, San Francisco, CA (US); Krishna Chaitanya Reddy Gangavaram, San Jose, CA (US); Antonio Passamani, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/236,522

(22) Filed: Apr. 21, 2021

(51) Int. Cl.
 *H04L 7/00* (2006.01)
 *H04L 27/04* (2006.01)
 *H04L 27/36* (2006.01)

(52) U.S. Cl.
 CPC ............ *H04L 7/0091* (2013.01); *H04L 27/04* (2013.01); *H04L 27/365* (2013.01); *H03F 2200/336* (2013.01)

(58) Field of Classification Search
 CPC ..... H04L 7/0091; H04L 27/04; H04L 27/365; H03F 2200/336
 See application file for complete search history.

(56) References Cited

U.S. PATENT DOCUMENTS

| | | | |
|---|---|---|---|
| 7,460,612 B2 | 12/2008 | Eliezer et al. | |
| 8,781,026 B2 | 7/2014 | Muhammad et al. | |
| 9,647,678 B2 | 5/2017 | Passamani et al. | |
| 10,200,232 B1 | 2/2019 | Wentzloff et al. | |
| 2010/0323638 A1* | 12/2010 | Lozhkin | H03F 3/24 455/113 |
| 2012/0236960 A1* | 9/2012 | Muhammad | H03L 7/1974 375/295 |
| 2014/0300426 A1* | 10/2014 | Mu | H04L 27/362 332/103 |
| 2016/0226685 A1* | 8/2016 | Egashira | H04B 1/0475 |
| 2016/0359614 A1 | 12/2016 | Hao et al. | |
| 2020/0091608 A1 | 3/2020 | Alpman et al. | |

* cited by examiner

*Primary Examiner* — Dac V Ha
(74) *Attorney, Agent, or Firm* — Fletcher Yoder, P.C.

(57) ABSTRACT

Embodiments disclosed herein relate to improving a power output of a transmitter of an electronic device. To do so, the transmitter may include signal selection circuitry to adjust a sign selection signal to accurately transition between polarities of a quadrature (e.g., I or Q) component signal stored in or for which an indication is stored in a storage cell of a radio frequency digital-to-analog converter. The sign selection signal may generate a separate adjusted sign selection signal for each polarity of each quadrature component signal such that a transition of the selection signal between a first value and a second value (e.g., logic high and low) occurs when the respective quadrature (e.g., +/− and I/Q component signal is a logic low. In this way, the signal selection circuitry reduces an error pulse in the output of the transmitter.

20 Claims, 13 Drawing Sheets

ACCURATE SIGN CHANGE FOR RADIO FREQUENCY TRANSMITTERS

BACKGROUND

The present disclosure relates generally to wireless communication, and more specifically to reducing signal distortion in radio frequency communications.

In an electronic device, a transmitter and a receiver may each be coupled to an antenna to enable the electronic device to both transmit and receive wireless signals, including digital signals. The electronic device may extract quadrature signals (e.g., in-phase (I) and quadrature (Q) digital signals) from an outgoing digital (e.g., baseband) signal to be modulated for transmission. Each of the I and Q signals may be positive or negative. In some cases, a single sign selection signal may be used to select a polarity (positive or negative) of the I/Q signals, which may in turn be used to generate an output signal from a radio frequency (RF) digital-to-analog converter (DAC) of the electronic device. However, the sign selection signal may cause distortion of the output signal if there is even a slight misalignment (e.g., mis-timing) of the sign selection signal with a rising or falling edge of the I or Q signals. The misalignment of the sign selection signal may cause a signal pulse which may result in noise in the output. Moreover, the noise caused by the distorted output signal may reduce or limit a power output of the transmitter and may negatively impact a sensitivity of a receiver receiving a signal sent by the transmitter.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An aspect of the disclosure provides an electronic device including one or more antennas and transmit circuitry configured to send a transmission signal to the one or more antennas. The transmit circuitry includes a digital front end that is configured to receive an input signal and generate a positive data signal, a negative data signal, and a sign selection signal based on the input signal. The transmit circuitry also includes sign selection adjusting circuitry operatively coupled to the digital front end. The sign selection adjusting circuitry is configured to receive the sign selection signal and generate a first adjusted sign selection signal based on a transition of the positive data signal. The sign selection adjusting circuitry is also configured to generate a second adjusted sign selection signal based on a transition of the negative data signal. The transmit circuitry also includes a digital-to-analog converter operatively coupled to the sign selection adjusting circuitry. The digital-to-analog converter is configured to receive the first adjusted sign selection signal and the second adjusted sign selection signal, store a plurality of signed values related to the positive data signal and the negative data signal, and change a polarity of at least one previously stored signed value of the plurality of signed values based on the first adjusted sign selection signal or the second adjusted sign selection signal. The digital-to-analog converter is also configured to generate the transmission signal by aggregating the plurality of signed values to improve signal quality of the transmission signal.

Another aspect of the disclosure provides a method which includes receiving, via processing circuitry, an input signal including in-phase and quadrature component signals. The method also includes generating, via the processing circuitry, a positive data signal and a negative data signal based on the input signal. The method also includes generating, via the processing circuitry, a sign selection signal based on the input signal. The method also includes generating, via the processing circuitry, a first adjusted sign selection signal based on the sign selection signal and associated with the positive data signal. A transition of the first adjusted sign selection signal between a first value and a second value occurs within one-fourth of a period of the positive data signal offset from a rising edge of the positive data signal. The method also includes generating, via the processing circuitry, a second adjusted sign selection signal based on the sign selection signal and associated with the negative data signal. A transition of the second adjusted sign selection signal between the first value and the second value occurs within one-fourth of a period of the negative data signal offset from a falling edge of the negative data signal. The method also includes applying, via the processing circuitry, one of the first adjusted sign selection signal or the second adjusted sign selection signal to one or more storage cells of a digital-to-analog converter to change a polarity of a signed value stored therein.

Another aspect of the disclosure provides an electronic device including one or more antennas and transmit circuitry configured to send a transmission signal to the one or more antennas. The transmit circuitry includes a digital front end configured to receive an input signal and generate a first data signal and a second data signal based on the input signal. The transmit circuitry also includes a digital-to-analog converter configured to store one or more signed values and generate the transmission signal. The transmit circuitry also includes signal selection circuitry operatively coupled to the digital front end and the digital-to-analog converter. The signal selection circuitry is configured to receive the first data signal and the second data signal and a sign selection signal. The signal selection circuitry generates a positive data signal and a negative data signal for each of the first data signal and the second data signal. The signal selection circuitry generates a first adjusted sign selection signal based on the sign selection signal and associated with the positive data signals. A transition of the first adjusted sign selection signal is between a first value and a second value. The signal selection circuitry generates a second adjusted sign selection signal based on the sign selection signal and associated with the negative data signals. A transition of the second adjusted sign selection signal is between the first value and the second value. The signal selection circuitry transmits the first adjusted sign selection signal and the second adjusted sign selection signal to the digital-to-analog converter to change a polarity of at least one of the one or more signed values.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
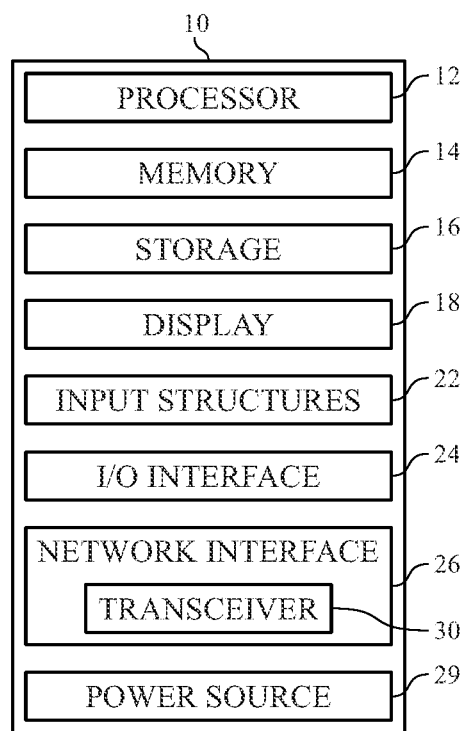
FIG. 1 is a block diagram of an electronic device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the term "approximately," "near," "about", and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

This disclosure is directed to improving an operation and/or a power output of a transmitter by reducing an occurrence of a signal pulse (e.g., an error pulse) in an output signal of a radio frequency (RF) digital-to-analog converter (DAC) of the transmitter. In particular, a sign selection signal is provided to the RF DAC to change a polarity of an in-phase (I) or quadrature (Q) signal of the transmitter (e.g., from a negative I signal to a positive I signal, from a positive I signal to a negative I signal, from a negative Q signal to a positive Q signal, and/or from a positive Q signal to a negative Q signal). That is, the sign selection signal indicates when to switch between a positive and negative quadrature (e.g., I or Q) signal, or vice versa. To enable the polarity change, the sign selection signal is applied at a transition (e.g., rising or falling edge) of the I signal and/or the Q signal. However, if the sign selection signal is misaligned with, for example, the rising edge of the I or Q signal, then the signal pulse may occur. The signal pulse may result in out-of-band noise that interferes with the output signal of the transmitter, lowering the power output of the transmitter, and decreasing a sensitivity of a receiver receiving the output signal of the transmitter.

In some cases, additional cells may be added to the RF DAC to reduce an occurrence of the signal pulse by storing an intermediate I or Q signal. However, the additional cells increase a size of the RF DAC of an electronic device (e.g., a smartphone, a tablet, a laptop, a wearable device, and so on) and thus undesirably increase a size of the electronic device. To reduce an occurrence of the signal pulse without increasing (or minimizing an increase of) the size of the electronic device, embodiments herein include a sign signal adjuster that adjusts a sign selection signal for each potential value of a cell of the RF DAC. That is, the sign signal adjuster may adjust a sign selection signal corresponding to each quadrature signal (e.g., +I, −I, +Q, and −Q). Each adjusted sign selection signal may be applied to a respective quadrature signal at a time offset from a transition (e.g., a rising or falling edge) of the respective quadrature signal, thus reducing an occurrence of the signal pulse, resulting in improved power output of the transmitter and improved sensitivity of a receiver receiving the output signal of the transmitter. For simplicity and convenience, most of the discussion below relates to the +I and −I signals (and corresponding sign selection signals). However, it should be understood that the same concepts and techniques also apply to the +Q and −Q signals (and corresponding sign selection signals).

FIG. 1 is a block diagram of an electronic device 10, according to an embodiment of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including computer code stored on a computer-readable medium) or a combination of both hardware and software elements. The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may represent a block diagram of any suitable computing device, including a desktop computer, a notebook computer, a portable electronic or handheld electronic device (e.g., a wireless electronic device or smartphone), a tablet, a wearable electronic device, and other similar devices. As more specific examples, the electronic device 10 may represent any model of a MacBook®, MacBook® Pro, MacBook Air®, iMac®, Mac® mini, Mac Pro®, iPod®, iPad®, iPhone®, Apple Watch®, or other devices, all available from Apple Inc. of Cupertino, Calif.

It should be noted that the processor 12 and other related items in FIG. 1 may be generally referred to herein as "data processing circuitry." Such data processing circuitry may be embodied wholly or in part as software, software, hardware, or any combination thereof. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may perform the various functions described herein and below.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as a network employing one of the IEEE 802.11x family of protocols (e.g., WI-FI®), and/or for a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 24.25-300 gigahertz (GHz)). The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas. In some embodiments, the transceiver 30 may include a radio frequency front-end (RFFE) that converts information from non-radio frequency baseband signals to radio frequency signals that may transmitted and/or received wirelessly. In some cases, to reduce or prevent an occurrence of a noise signal interfering with an output of the transceiver 30, the electronic device 10 may include processing circuitry that generates a sign selection signal for each potential input value (e.g., quadrature signal) from a local oscillator (LO). Moreover, the processing circuitry may include a sign signal adjuster that adjusts a time offset of a sign selection signal from a transition (e.g., a rising or falling edge) of a respective quadrature signal and transmits the adjusted sign selection signal to the RF DAC of the transceiver. In particular, when the RF DAC applies the sign selection signal to the respective input value (e.g., quadrature signal) from the LO at the time offset from the transition of the respective quadrature signal, an occurrence of the noise signal may be reduced, resulting in improved power output of the transmitter and improved sensitivity of a receiver receiving the output signal of the transmitter.

The power source 29 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
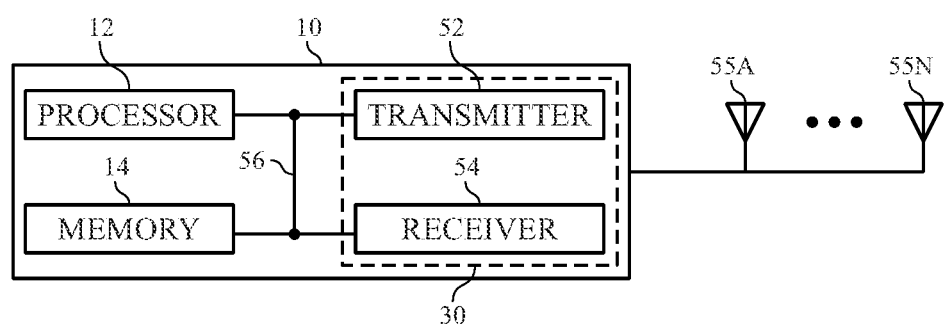
FIG. 2 is a functional block diagram of the electronic device of FIG. 1 that may implement the components shown in FIG. 1 and/or the circuitry and/or components described in the following figures, according to embodiments of the present disclosure.

FIG. 2 is a functional block diagram of the electronic device 10 that may implement the components shown in FIG. 1 and/or the circuitry and/or components described in the following figures, according to embodiments of the present disclosure. As illustrated, the processor 12, the memory 14, the transceiver 30, the transmitter 52, the receiver 54, and/or the antennas (illustrated as 55A-55N) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and a remote location via, for example, a network or direction connection associated with the electronic device 10 and an external transceiver (e.g., in the form of a cell, eNB (E-UTRAN Node B or Evolved Node B), base stations, and the like. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, each beam, when implemented as multi-beam antennas, may have its own transceiver 30. The electronic device 10 may include (not shown) multiple transmitters, multiple receivers, multiple transceivers, and/or multiple antennas as needed for various communication standards.

As illustrated, the various components of the electronic device 10 may be communicatively coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other component(s).

The transmitter 52 may wirelessly transmit packets having different packet types or functions (e.g., generated by the processor 12). The receiver 54 may wirelessly receive packets having different packet types. In some examples, the receiver 54 may detect a type of a received packet and process the packet accordingly. In some embodiments, the transmitter 52 and the receiver 54 may transmit and receive information via other wired or wireline systems or devices.

The transmitter 52 and a receiver 54 of the transceiver 30 may be coupled to at least one antenna 55 to enable the electronic device 10 to transmit and receive wireless signals. In some embodiments, all or some components of the transmitter 52 and/or receiver 54 may be disposed within additional or different elements of the transceiver 30 and/or the electronic device 10. For example, as discussed below with respect to FIG. 3, the transmitter (e.g., TX circuit) 52 and the receiver (e.g., RX circuit) 54 may be disposed within a radio frequency front-end (RFFE) of the transceiver 30.

Figure 3:
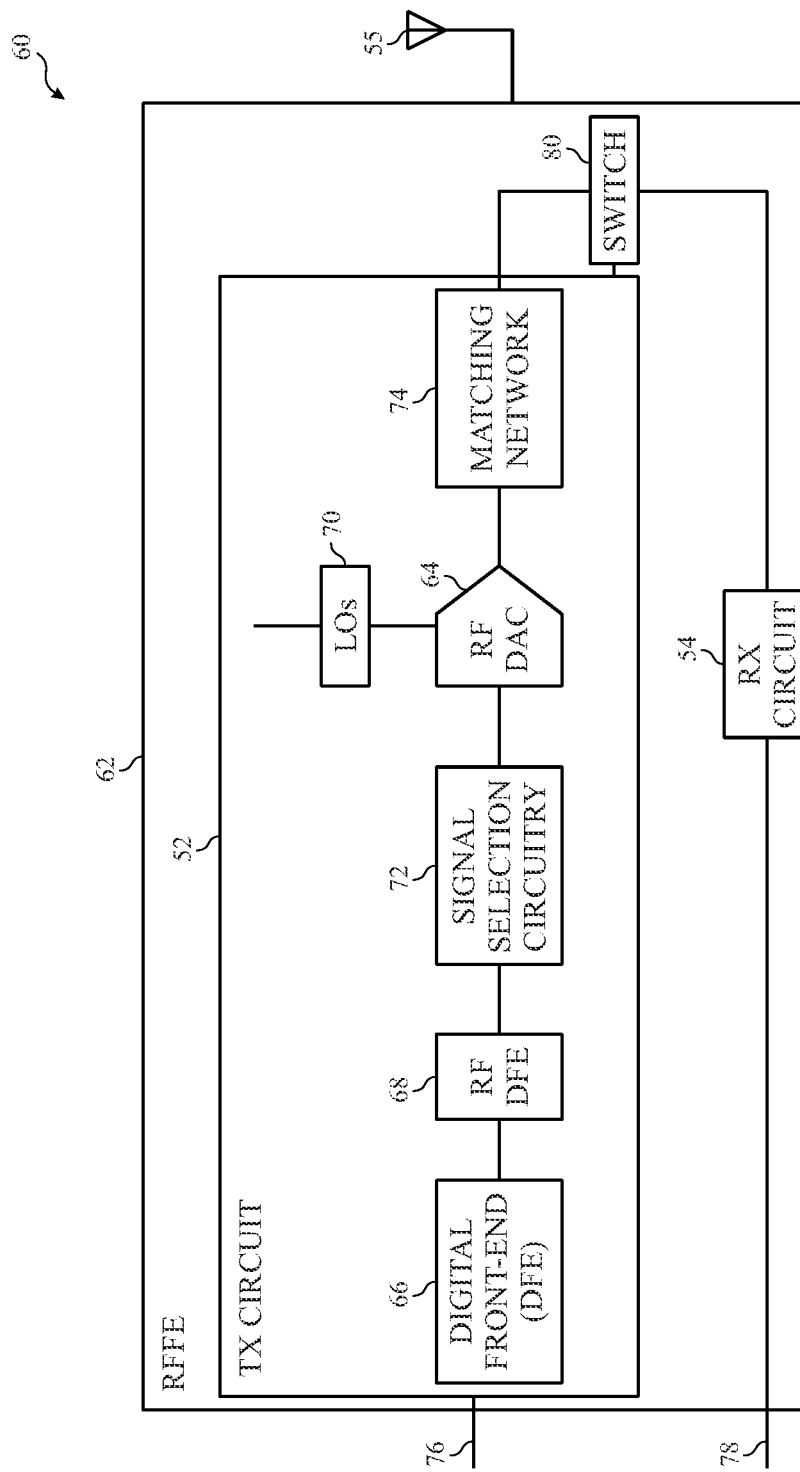
FIG. 3 is a block diagram of example transceiver circuitry including a radio frequency front-end (RFFE), according to an embodiment of the present disclosure.

FIG. 3 is a block diagram of example transceiver circuitry 60 including a radio frequency front-end (RFFE) 62, according to an embodiment of the present disclosure. The transceiver circuitry 60 may be disposed in the transceiver 30 discussed with respect to FIG. 2. As shown, the RFFE 62 is coupled to and provides an output signal to be transmitted via the one or more antennas 55. The TX circuit 52 may receive an input signal 76 from, for example, a baseband processor (not shown) that may manage radio functions of the electronic device 10. The RX circuit 54 may provide an output signal 78 to the baseband processor.

As shown, the TX circuit 52 includes a digital front-end (DFE) 66, a radio frequency (RF) DFE 68, an RF digital-to-analog convertor (RF DAC) 64, one or more local oscillators (LOs) 70, a signal selection circuitry 72, a matching network 74, and a switch 84. The RF DAC 64 may facilitate generating a radio frequency signal to be transmitted via the at least one antenna 55.

The DFE 66 may receive the input signal 76 to the TX circuit 52, and generate and/or provide quadrature (e.g., I and Q) component signals of a baseband signal (e.g., the input signal 76) to be transmitted to the RF DFE 68. That is, the DFE 66 may be communicatively coupled to the RF DFE 68. The RF DFE 68 may adjust a frequency of the I and Q signals (e.g., originally received at a baseband frequency) and provide the adjusted signal to the signal selection circuitry 72. For example, the RF DFE 68 may increase a frequency of the I and Q signals (e.g., to a radio frequency)

and provide the higher frequency I and Q signals to the signal selection circuitry 72 (e.g., sign selection circuitry).

The RF DFE 68 may output a sign selection signal that may indicate when to switch between a positive and a negative quadrature (e.g., I or Q) signal. For example, at a first time, to generate a desired output signal from the RFFE 62, the RF DAC 64 may output a positive I signal based on the sign selection signal at the first time. At a second, subsequent time, the RF DAC 64 may output a negative I signal to generate a second, subsequent output signal from the RFFE 62 based on the sign selection signal at the second time. However, without the signal selection circuitry 72, if the sign selection signal may be misaligned with (e.g., early or late when compared to) a rising or falling edge of the quadrature signal (e.g., the positive I signal), a noise signal may be generated and output by the RFFE 62. For example, if the sign selection signal is received before or after a rising edge of the positive I signal or a falling edge of the negative I signal, the output of the RFFE 62 may include an error pulse that interferes with the output signal of the RFFE 62.

Embodiments herein provide apparatuses and techniques to reduce or substantially prevent an occurrence of interference caused by the noise signal generated as a result of a misaligned (e.g., late or early) sign selection signal. To do so, the RFFE 62 includes the signal selection circuitry 72 which may include a sign signal adjuster and one or more data generators, discussed in detail with respect to FIGS. 7-10B below.

As discussed below, the sign signal adjuster generates and/or adjusts one or more an adjusted sign selection signals for each polarity of the I and Q signals based on the sign selection signal generated by the RF DFE 66. For example, the sign signal adjuster may generate a positive adjusted sign selection signal (e.g., Sign +I and/or Sign +Q) and a negative adjusted sign selection signal (e.g., Sign −I and/or Sign −Q) for each quadrature signal (e.g., the I and Q signal). Each adjusted sign selection signal may be applied to a respective quadrature signal (e.g., the I or Q signal) at a time offset from a transition (e.g., a rising or falling edge) of the respective quadrature signal, thus reducing an occurrence of the signal pulse, resulting in improved power output of the transmitter 52 and improved sensitivity of a receiver receiving the output signal of the transmitter 52. The one or more data generators of the signal selection circuitry 72 may also generate one or more data signals to output each possible polarity of the I and Q signals. For example, the one or more data generators may generate a +I signal and a −I signal for the I signal from the RF DFE 68. Similarly, the data generators may generate a +Q signal and a −Q signal for the Q signal from the RF DFE 68.

The signal selection circuitry 72 may provide the one or more signals (e.g., the adjusted sign selection signals and/or one or more data signals) to the RF DAC 64. The RF DAC 64 may also receive one or more input signals from the LOs 70 for frequency modulation or mixing purposes. The RF DAC 64 may store the I and Q signals or indications of the I and Q signals in one or more cells thereof. The cells of the RF DAC 64 are discussed in detail with respect to FIGS. 4A-4D, 7, and 9A-10B below.

The RF DAC 64 may output one or more I and/or Q signals (or values associated with or indicative of the I/Q signals) as stored or indicated by the one or more cells to the matching network 74 based on the input signal 76, the signals from the LOs 70, and the signals from the signal selection circuitry 72. The RF DAC 64 and/or the matching network 74 may combine (e.g., aggregate) the one or more I and/or Q signals stored in or for which an indication is stored in the one or more cells of the RF DAC 64 to be output to and transmitted by the one or more antennas 55. In some embodiments, the matching network 74 may balance an impedance of the RF DAC 64 and the one or more antennas 55. The switch 80 may isolate the RX circuit 54 from a transmission (e.g., TX) signal from the TX circuit 52. The switch 80 may also or alternatively isolate the TX circuit 52 from a signal received by the one or more antennas 55 (e.g., an RX signal).

Figure 4A:
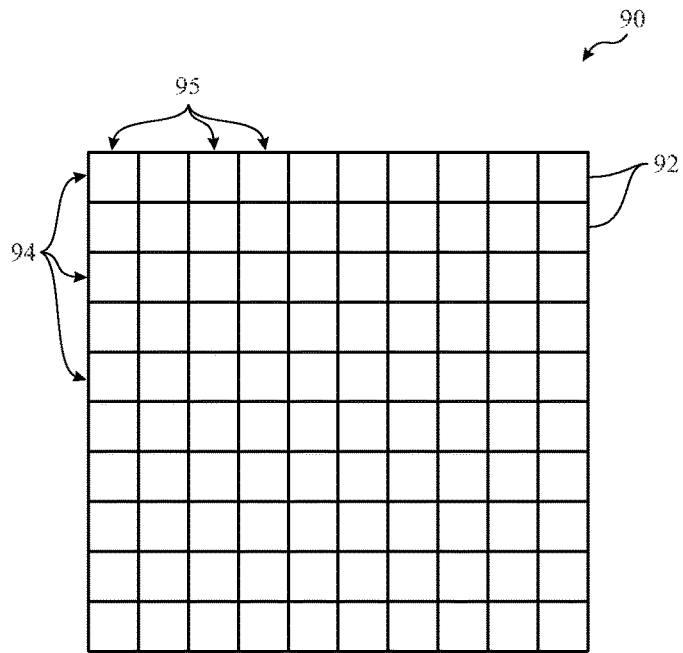
FIG. 4A is a schematic diagram of example storage cells of a radio frequency digital-to-analog converter (RF DAC), according to an embodiment of the present disclosure.

FIG. 4A is a schematic diagram of example storage cells 92 of a radio frequency digital-to-analog converter (RF DAC) 64, according to an embodiment of the present disclosure. As shown, the cells 92 are arranged in a grid-like pattern with a number of rows 94 and columns 95. It should be noted that additional or alternative arrangements of the cells 92 are contemplated (e.g., a single row, a single column, a ring or circular arrangement, and so on). Further, while the RF DAC 64 includes 100 cells 92 (e.g., 10×10), it should be understood that the RF DAC 64 may include more or fewer cells 92. For example, the RF DAC 64 may include 1024 cells (e.g., 32×32).

Each cell 92 may store an I signal or an indication of the I signal (e.g., data, such as one or more bits, corresponding to the I signal), a Q signal or an indication of the Q signal (e.g., data, such as one or more bits, corresponding to the Q signal), or an off signal or an indication of the off signal (e.g., data, such as one or more bits, corresponding to the off signal). The I/Q signal in a particular cell may be associated with a sign (e.g., a polarity, such as positive (+) or negative (−)), as discussed below with respect to FIGS. 4B-4D. Each cell 92 may be coupled to sign selection signal circuitry used to determine a value or signal of that cell 92. For example, the sign selection signal circuitry may determine a signal and/or polarity of that signal (e.g., +I, −I, +Q or −Q) to be stored in each cell 92 of the RF DAC 64. The sign selection signal circuitry is discussed with respect to FIGS. 5-10B below.

Figure 4B:
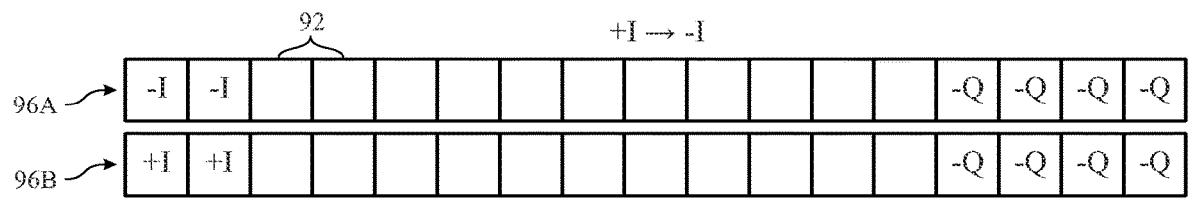
FIG. 4B is a block diagram of sign changes for in-phase signals in storage cells of the radio frequency digital-to-analog converter of FIG. 4A, according to an embodiment of the present disclosure.

FIG. 4B is a block diagram of sign changes for in-phase signals in storage cells 92 of the RF DAC 64 of FIG. 4A, according to an embodiment of the present disclosure. For simplicity, a single row 96A, 96B and a single sign transition (e.g., a polarity transition of the I signals) are illustrated. The rows 96A and 96B correspond to a single row 94 of the RF DAC 64 discussed with respect to FIG. 4A. The row 96A illustrates values of the cells 92 before the sign transition and the row 96B illustrates values of the cells 92 after the sign transition of the I signals (and the corresponding values stored in the cells 92).

As shown, the row 96A includes two cells 92 with a value of +I and four cells 92 with a value of −Q. These values correspond to the I/Q signals received by the RF DAC 64 and stored in the respective cells 92. Upon receiving a sign selection signal for the I signals (e.g., I data), circuitry of the RF DAC 64 may cause a change in polarity of the I signals (and corresponding data) in one or more cells 92 of the RF DAC 64. That is, a polarity of each I signal in the RF DAC 64 may be changed. The signal selection circuitry 72 discussed with respect to FIG. 3 may be used to ensure the polarity of the in-phase signals accurately changes by performing the transition in the offset period, resulting in a reduced occurrence of the error pulse, and thus an improved power output of the transmitter and improved sensitivity of a receiver receiving the output signal of the transmitter. As an example, for each cell 92 storing a +I signal (or indication of the signal), the resulting signal (or indication of the signal) in that cell 92 after the polarity transition is −I. Similarly, for each cell 92 storing a −I signal (or indication of the signal), the resulting signal in that cell 92 after the polarity transition is +I. As shown, the resulting row 96B includes two cells 92 with a value of +I and four cells with −Q. That is, a polarity of any cell 92 that does not store a value associated with the polarity transition (e.g., I) does not change.

Figure 4C:
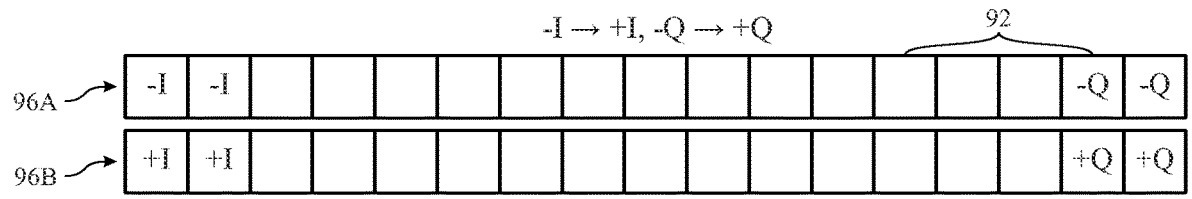
FIG. 4C is a block diagram of sign changes for in-phase and quadrature signals in storage cells of the radio frequency digital-to-analog converter of FIG. 4A, according to an embodiment of the present disclosure.

FIG. 4C is a block diagram of sign changes for in-phase and quadrature signals in storage cells 92 of the RF DAC 64 of FIG. 4A, according to an embodiment of the present disclosure. Similar to FIG. 4B, a single row 98A, 98B of the RF DAC 64 is shown. However, FIG. 4C involves a dual polarity transition (e.g., −I to +I and −Q to +Q) compared to the single sign transition (e.g., +I to −I) discussed with respect to FIG. 4B.

The row 98A illustrates values of the cells 92 before the dual sign selection and the row 98B illustrates values of the cells 92 after the dual sign change. Upon receiving a sign selection signal for the I signals and the Q signals, circuitry of the RF DAC may cause a sign of the I signals and Q signals to change. As with FIG. 4B above, the signal selection circuitry 72 discussed with respect to FIG. 3 may be used to ensure the polarity of the I signals and Q signals accurately change by performing the polarity transitions in an offset period from the respective I or Q signals, resulting in a reduced occurrence of the error pulse and thus an improved power output of the transmitter and improved sensitivity of a receiver receiving the output signal of the transmitter. As an example, cells 92 with an original value of +I may change to a value of −I while cells 92 with an original value of −Q may change to a value of +Q, as shown in the row 98B. Similarly, the sign selection process may result in cells 92 with an original value of −I to change to a value of +I while cells with an original value of +Q to change to a value of −Q.

It should be understood that the sign selection (e.g., polarity change) processes of FIGS. 4B and 4C may be used for a sign selection of one or more cells having a value of I or Q. Further, while the sign selection processes of FIGS. 4B and 4C are discussed with respect to cells 92 storing a particular signal or data type (e.g., +I, −I, +Q, −Q), it should be understood that these processes could be applied to a single cell 92, a row 94 of the RF DAC 64, a column 95 of the RF DAC 64, or any combination thereof.

Figure 4D:
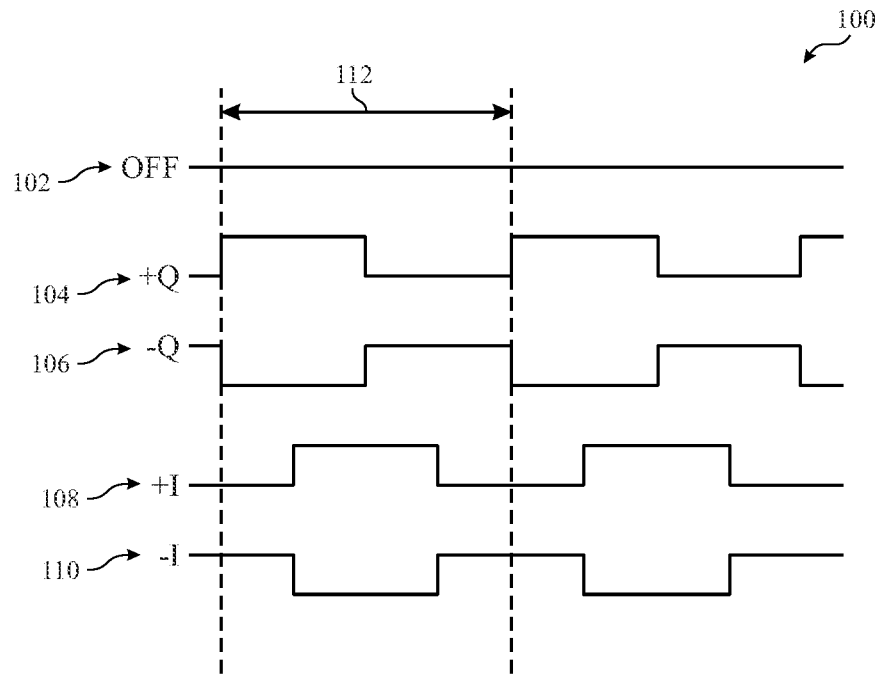
FIG. 4D is a timing diagram of various states that may be stored in or indicated by each storage cell of the radio frequency digital-to-analog converter of FIG. 4A.

FIG. 4D is a timing diagram of various states (e.g., values) that may be stored in or indicated by each storage cell 92 of the RF DAC 64 of FIG. 4A. A first state 102 indicates an off state. As illustrated, the off state may be represented by a steady state (e.g., of a logic low or 0), though any suitable signal indicative of the off state may be used. A second state 104 illustrates a positive quadrature component (e.g., a +Q signal) having a period 112 measured between consecutive rising edges (or falling edges) of the signal. In some embodiments, the logic high may be referred to as a first value and the logic low may be referred to as a second value, the second value being less than (e.g., smaller than) the first value.

A third state 106 illustrates a negative quadrature component (e.g., a −Q signal) having the same period 112 as the second state 104. However, a phase of the −Q signal of the third state 106 is shifted 180 degrees from a phase of the +Q signal of the second state 104. That is, when the +Q signal of the second state 104 is high, the −Q signal of the third state 106 is low. Similarly, when the +Q signal of the second state 104 is low, the −Q signal of the third state 106 is high.

A fourth state 108 illustrates a positive in-phase component (e.g., a +I signal) having a same period 112 as the period of the +Q signal of the second state 104 and the −Q signal of the third state 106. However, a phase of the +I signal of the fourth state 108 is shifted 90 degrees from the phase of the +Q signal of the second state 104. That is, a rising edge of the +I signal of the fourth state 108 occurs at a midpoint of the high +Q signal of the second state 104 or a midpoint of the low −Q signal of the third state 106.

A fifth state 110 illustrates a negative in-phase component (e.g., a −I signal) having a same period 112 as the period of the +I signal of the fourth state 108. A phase of the −I signal of the fifth state 110 is shifted 180 degrees from the phase of the +I signal of the fourth state 108. That is, when the +I signal of the fourth state 108 is high, the −I signal of the fifth state 110 is low. Similarly, when the +I signal of the fourth state 108 is low, the −I signal of the fifth state 110 is high. As illustrated and discussed above, each I/Q signal can be negative or positive. Thus, each cell in the RF DAC 64 discussed with respect to FIGS. 3 and 4A-4D may be +I, −I, +Q, −Q, or off.

Figure 5:
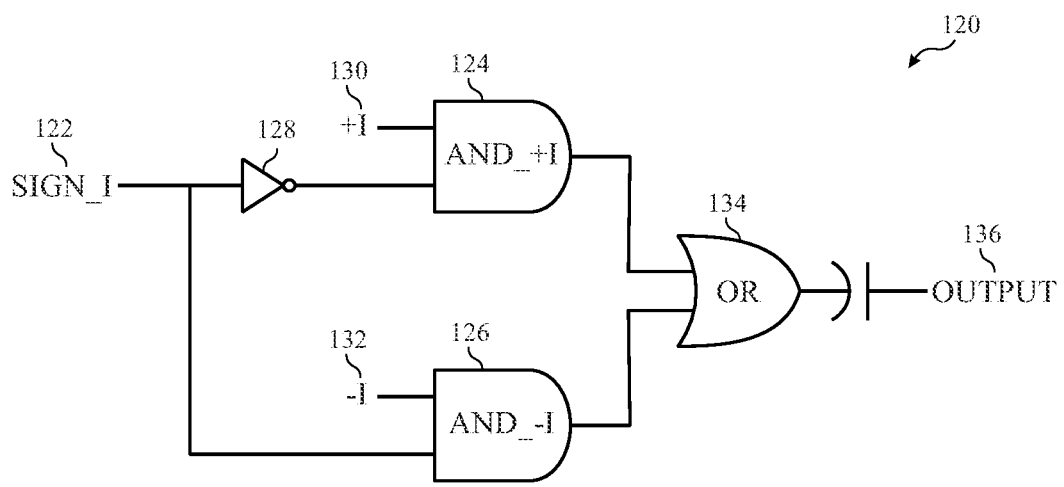
FIG. 5 is a schematic diagram of example sign selection signal circuitry that selects an output signal to store in or for which to store an indication in a cell of the radio frequency digital-to-analog converter of FIG. 4A using a single sign selection signal.

FIG. 5 is a schematic diagram of example sign selection signal circuitry 120 that selects an output signal (e.g., a polarity of an output signal) to store in or for which to store an indication in a cell 92 of the RF DAC 64 of FIG. 4A using a single sign selection signal, without the signal selection circuitry 72. For simplicity, the discussion of FIG. 5 below is directed to a sign selection of an I signal of the RF DAC 64. However, it should be understood that the same or substantially similar circuitry may be used for a sign selection of a Q signal of the RF DAC 64. The example circuitry 120 may be coupled to a cell 92 of the RF DAC 64. That is, a duplicate of the example circuitry 120 may be coupled to each individual cell 92 of the RF DAC 64.

As shown, the example circuitry 120 includes a first AND gate (e.g., AND_+I) 124, a second AND gate (e.g., AND_−I) 126, an inverter 128, and an OR gate 134. The example circuitry 120 receives a Sign_I signal 122 from the RF DFE 68 discussed with respect to FIG. 3. The Sign_I signal 122 indicates a sign selection (or sign change) for the I signal in the corresponding cell of the RF DAC 64. The first AND gate 124 receives an inverted Sign_I signal 122 via the inverter 128 and the second AND gate 126 receives the Sign_I signal 122. The first AND gate 124 receives a +I signal 130 (e.g., LO_+I) from a first local oscillator (not shown in FIG. 5). The second AND gate 126 receives a −I signal 132 (e.g., LO_−I) from a second local oscillator (not shown in FIG. 5).

The OR gate 134 receives the outputs of the first AND gate 124 and the second AND gate 126. That is, when the Sign_I signal 122 is a logic low (e.g., 0, which is inverted by via the inverter 128) and the +I signal 130 is a logic high (e.g., 1), the OR gate 134 receives a logic high signal (e.g., the +I signal 130) from the first AND gate 124. On the other hand, if the Sign_I signal 122 is a logic high and the −I signal 132 is a logic high, the OR gate 134 receives a logic high signal (e.g., the −I signal 132) via the second AND gate 126. When the output of either of the first AND gate 124 or the second AND gate 126 is a logic high, an output 136 of the example circuitry 120 is a logic high. In some embodiments, the inverter 128 may be coupled to the second AND gate 126. In that case, an output 136 of the example circuitry may be switched between the +I signal 130 signal and the −I signal 132 relative to the Sign_I signal 122.

The output 136 matches the +I signal 130 if the Sign_I signal 122 transitions from a logic high to a logic low (e.g., from 1 to 0) simultaneously with a rising edge of the +I signal 130 or the output 136 matches the or the −I signal 132 if the Sign_I signal 122 transitions from a logic low to a logic high (e.g., from 0 to 1) simultaneously with a falling edge of the −I signal 132. However, if the Sign_I signal 122 transitions to a logic low after the rising edge of the +I signal 130 or the Sign_I signal 122 transitions to a logic high after the falling edge of the −I signal 132, an error pulse occurs at the output 136, as discussed with respect to FIGS. 6A-6C below. To reduce an occurrence of and distortion of the output signal caused by the error pulse, embodiments herein may utilize adjusted sign selection signals applied to a respective quadrature signal at a time offset from a transition (e.g., a rising or falling edge) of the respective quadrature signal, resulting in improved power output of the transmitter and improved sensitivity of a receiver receiving the output signal of the transmitter.

Figure 6A:
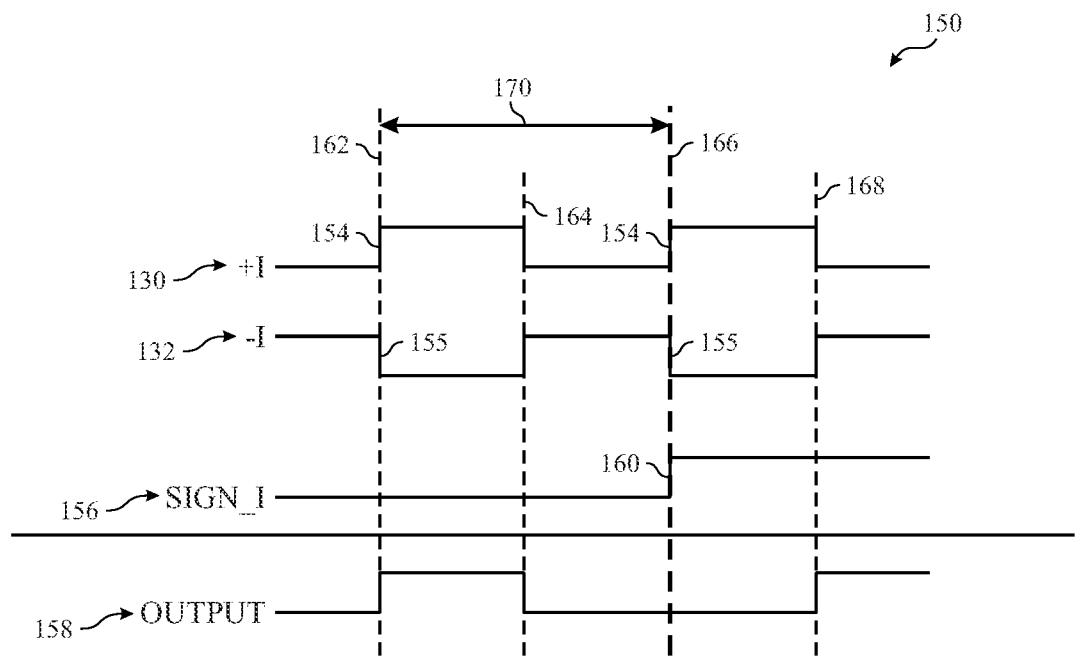
FIG. 6A-6C are timing diagrams of sign change operations that facilitate selecting an output signal to store in or for which to store an indication in a cell of the RF DAC of FIG. 3.
Figure 6B:
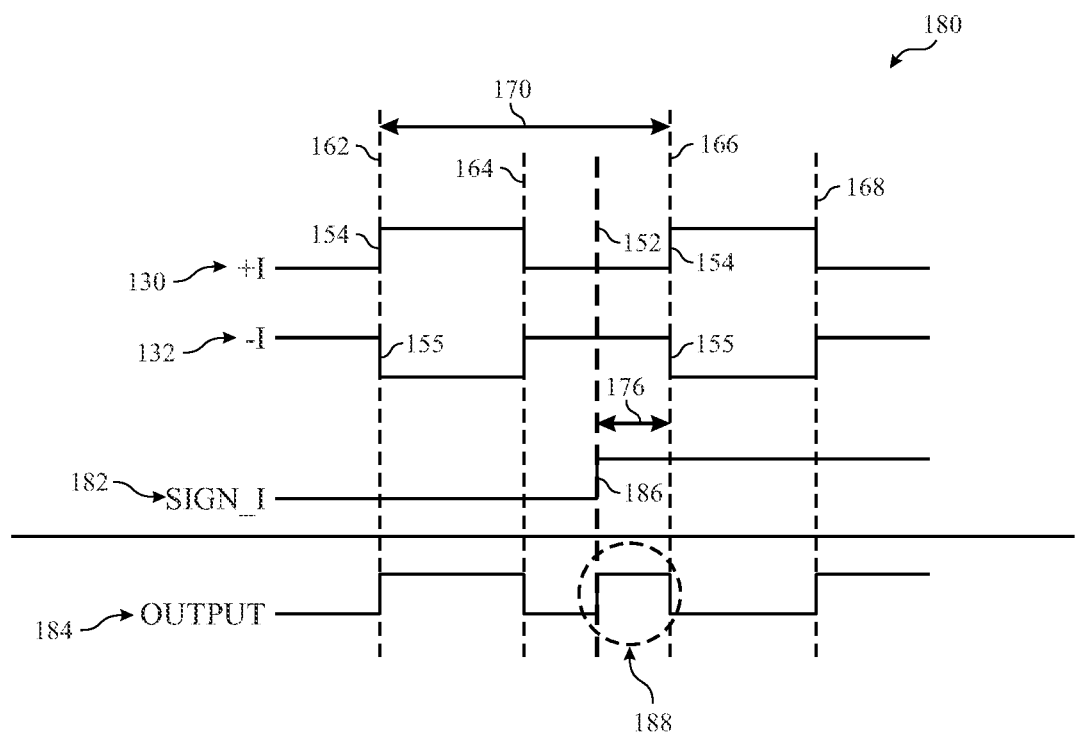
Figure 6C:
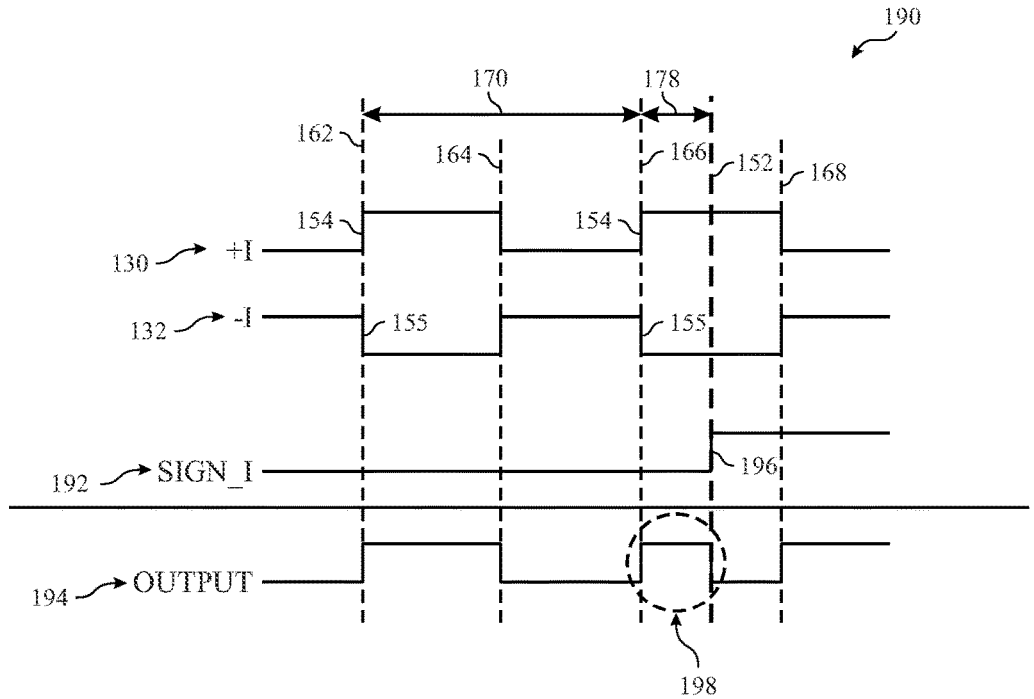

FIGS. 6A-6C are timing diagrams of sign change operations that facilitate selecting an output signal to store in or for which to store an indication in a particular cell 92 of the RF DAC 64 discussed with respect to FIGS. 3 and 4A-4D, as performed by the TX circuit 52 of FIG. 3, without the signal selection circuitry 72 (e.g., without adjusting a timing of the sign selection signal). The sign change operations of FIGS. 6A-6C are performed using a single sign selection signal for a transition of the polarity of the I signal from +I to −I. That is, the output 136 of the example circuitry 120 of FIG. 5 transitions from the +I signal 130 to the −I signal 132. While FIGS. 6A-6C are directed to a sign selection of the I signal, it should be understood that the same or similar techniques and processes can be used for a sign selection of the Q signal, discussed with respect to FIGS. 4A-4D. Similarly, while FIGS. 6A-6C relate to a sign selection (e.g., a transition) of a negative polarity signal from a positive polarity signal (e.g., from +I to −I), it should be understood that the same or similar techniques and processes may be used for a sign selection of a positive polarity signal from a negative polarity signal (e.g., from −I to +I, from −Q to +Q).

For each of FIGS. 6A-6C, a period 170 of the +I signal 130 is the same as the period 170 of the −I signal 132. Further, the +I signal 130 is 180 degrees out-of-phase with the −I signal 132. That is, the rising edges 154 of the +I signal 130 occur simultaneously with the falling edges 155 of the −I signal 132. The +I signal 130 and the −I signal 132 transition from logic high to logic low or from logic low to logic high at a first transition 162, a second transition 164, a third transition 166, and a fourth transition 168. Each of the transitions 162-168 occur at an edge or a midpoint of the period 170. A duration of time between each of the transitions (e.g., between 162 and 164, between 164 and 166, and between 166 and 168) is about one-half of the period 170.

The sign change operation 150 illustrated in FIG. 6A receives input signals +I 130, −I 132, and Sign_I 156, and generates an output signal 158 (which corresponds to the output 136 of FIG. 5 above) based on the operations discussed above with respect to FIG. 5. A transition 160 of the Sign_I signal 156 from a logic low to a logic high occurs at a rising edge 154 of the +I signal 130 and a falling edge 155 of the −I signal 132, at the third transition 166, as indicated by a bold line 152.

Before the Sign_I signal 156 transitions 160 to the logic high, the output 158 is the +I signal 130 (due to the inverter 128 of FIG. 5 inverting the Sign_I signal 122, 156 to the logic high and the AND_+I gate 124 performing an AND operation between the logic high and the +I signal 130). When the Sign_I signal 156 transitions 160 to the logic high, the output 158 transitions to follow the −I signal 132 (due to AND_−I gate 126 performing an AND operation between the logic high and the −I signal 132). That is, the output 158 is a logic low between the second transition 164 and the third transition 166. Thus, the transition 160 of the Sign_I signal 156 occurs "on time" (e.g., at the third transition 166) and is a clean transition without distortion of the output 158.

The sign change operation 180 illustrated in FIG. 6B receives input signals +I 130, −I 132, and Sign_I 182, and generates an output signal 184 (which correspond to the output 136 of FIG. 5 above) based on the operations discussed above with respect to FIG. 5. A transition 186 of the Sign_I signal 182 from a logic low to a logic high occurs before a falling edge 155 of the −I signal 132 at the third transition 166 (e.g., an early transition), as indicated by the bold line 152. That is, the transition 186 of the Sign_I signal 182 occurs at a time interval 176 before the third transition 166.

When the Sign_I signal 182 is the logic low, the output 184 is the +I signal 130. When the Sign_I signal 182 transitions 186 to the logic high, the output 184 transitions to follow the −I signal 132. However, because the transition 186 of the Sign_I signal 182 occurs before the falling edge 155 of the −I signal 132 at the third transition 166, the output 184 has an error pulse 188 during the time interval 176 (between the transition 186 of the Sign_I signal 182 and the third transition 166). The error pulse 188 indicates that the transition of the output signal 184 from the +I signal 130 to the −I signal 132 is not a clean transition and may cause distortion of the output of the TX circuit 52, which may reduce a power output of the TX circuit 52 and negatively impact a sensitivity of a receiver receiving a signal from the TX circuit 52.

The sign change operation 190 illustrated in FIG. 6C receives input signals +I 130, −I 132, and Sign_I 192, and generates an output signal 194 (which correspond to the output 136 of FIG. 5 above) based on the operations discussed with respect to FIG. 5 A transition 196 of the Sign_I signal 192 from a logic low to a logic high occurs after a rising edge 154 of the +I signal 130 at the third transition 166 (e.g., a late transition), as indicated by the bold line 152. That is, the transition 196 of the Sign_I signal 192 occurs at a time interval 178 after the third transition 166.

When the Sign_I signal 192 is the logic low, the output 194 is the +I signal 130. When the Sign_I signal 192 transitions 196 to the logic high, the output 194 transitions to follow the −I signal 132. However, because the transition 196 of the Sign_I signal 192 occurs after the rising edge 155 of the −I signal 132 at the third transition 166, the output 194 has an error pulse 198 during the time interval 178 (between the third transition 166 and the transition 196 of the Sign_I signal 192). Similar to the error pulse 188 of FIG. 6B, the error pulse 198 indicates that the transition of the output signal 184 from the +I signal 130 to the −I signal 132 is not a clean transition and may cause distortion of the output of the TX circuit 52, which may reduce a power output of the TX circuit 52 and negatively impact a sensitivity of a receiver receiving a signal from the TX circuit 52.

Figure 7:
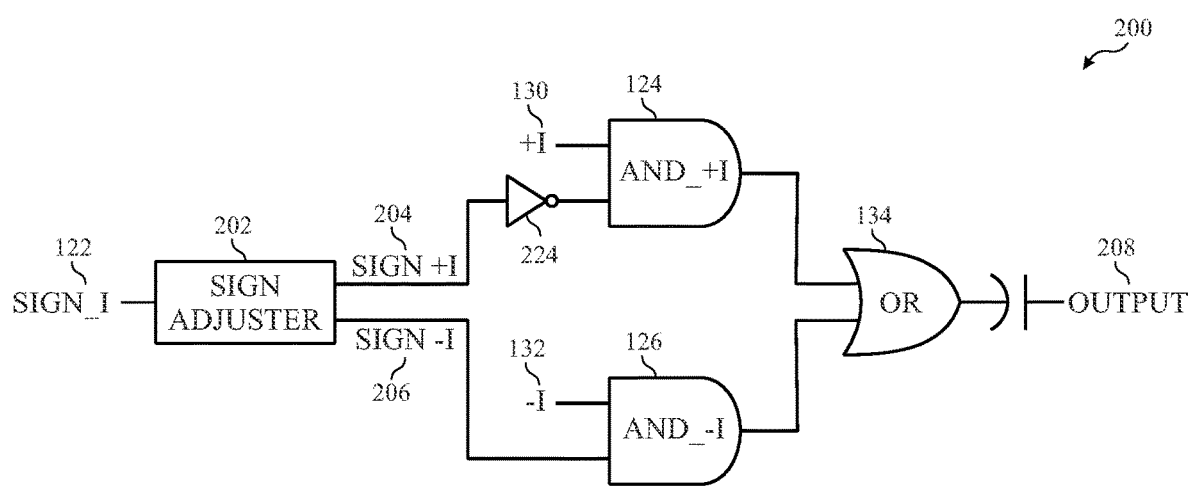
FIG. 7 is a schematic diagram of example sign selection signal circuitry that selects an output signal to store in or for which to store an indication in a cell of the radio frequency digital-to-analog converter of FIG. 4A, according to an embodiment of the present disclosure.

FIG. 7 is a schematic diagram of example sign selection signal circuitry 200 that selects an output signal to store in or for which to store an indication in a cell of the RF DAC 64 of FIG. 4A, according to an embodiment of the present disclosure. While the circuitry 200 is discussed with respect to the I signal (e.g., +I, −I), it should be understood that the same or similar techniques and apparatus may be used with the Q signal (e.g., +Q, −Q), as discussed above. The circuitry 200 is similar to the circuitry 120 of FIG. 5, except that the circuitry 200 includes a sign signal adjuster 202 (e.g., sign selection adjusting circuitry) which may be disposed within the signal selection circuitry 72. In some embodiments, the sign signal adjuster 202 may be implemented as or executed by one or more processors of the electronic device 10, such as the processor 12 discussed with respect to FIGS. 1 and 2.

The sign signal adjuster 202 is coupled to the first AND gate 124 and the second AND gate 126 and receives the Sign_I signal 122. The sign signal adjuster 202 may generate and/or adjust a sign selection signal for each polarity of the I signals 130, 132. For example, the sign signal adjuster 202 may generate a first adjusted sign selection signal (e.g., Sign +I) 204 for the +I signal 130 and a second adjusted sign selection signal (e.g., Sign −I) 206 for the −I signal 132. As shown, an inverter 224 may invert the first adjusted sign signal 204. Additionally or alternatively, an inverter (not shown) may invert the second adjusted sign signal 206. In some embodiments, the sign signal adjuster 202 may invert one of the sign selection signals 204, 206 with respect to the Sign_I signal 122 and the other sign selection signal 204, 206. That is, the first adjusted sign selection signal 204 may transition from the logic high to the logic low when the second adjusted sign selection signal 206 transitions from the logic low to the logic high. For example, the inverted Sign +I signal 204 may be the logic low when the Sign_I signal 122 is the logic high and the Sign +I signal may be the logic high when the Sign_I signal is the logic low. In the alternative, the Sign −I signal 206 may be inverted with respect to the Sign +I signal 204.

A transition of the inverted first adjusted sign selection signal 204 from a logic low to a logic high may indicate a transition of the output 208 of the circuitry 200 to be substantially equivalent to the +I signal 130. For example, when the inverted first adjusted sign selection signal 204 transitions to the logic high, the AND_+I gate 124 performs an AND operation between the logic high and the +I signal 130. Similarly, a transition of the second adjusted sign selection signal 206 from a logic low to a logic high may indicate a transition of the output 208 to be substantially equivalent to the −I signal 132. For example, when the second adjusted sign selection signal 206 transitions to the logic high, the AND_−I gate 126 performs an AND operation between the logic high and the −I signal 132.

The sign signal adjuster 202 may generate (and/or adjust) the individual sign selection signals 204, 206 based on the Sign_I signal 122. For example, a transition of the sign selection signals 204, 206 between the logic low and the logic high may be based on a transition of the Sign_I signal 122 between the logic low and the logic high. That is, when the Sign_I signal 122 transitions to the logic high, each of the inverted first adjusted sign selection signal 204 and the second adjusted sign selection signal 206 may transition to the logic high. However, the sign signal adjuster 202 may shift a timing of the transition of the adjusted sign selection signals 204, 206 such that the transition of the adjusted sign selection signals 204, 206 occurs within a time offset of the Sign_I signal 122 which reduces an occurrence of the error pulse in the output signal 208, regardless of a misalignment of the transition of the Sign_I signal 122.

As an example, the sign signal adjuster 202 may shift the transition of the first adjusted sign selection signal 204 such that the transition occurs before a rising edge of the corresponding +I signal 130. In particular, the transition of the first adjusted sign selection signal 204 may occur within about one-half of a period of the +I signal 130 from the rising edge of the +I signal 130. This offset from the rising edge may provide a time buffer (e.g., a quarter of the period +I signal 130) for which the transition of the first adjusted sign selection signal 204 may be applied early or late (e.g., relative to the rising edge of the +I signal 130) and still be applied accurately (e.g., without generating the error pulse in the output 208 of the circuitry 200). Thus, the sign signal adjuster 202 causes the transition of the first adjusted sign selection signal 204 to occur when the +I signal 130 is a logic low (even when the transition of the first adjusted sign selection signal 204 is applied early or late, as long as the transition of the first adjusted sign selection signal 204 occurs within one-fourth of the period +I signal 130 from a rising edge of the +I signal 130) to prevent an error pulse in the output 208 of the circuitry 200.

Similarly, the sign signal adjuster 202 may shift the transition of the second adjusted sign selection signal 206 such that the transition occurs after a falling edge of the corresponding −I signal 132. In particular, the transition of the second adjusted sign selection signal 206 may occur within about one-half of a period of the −I signal 132 from the falling edge of the −I signal 132. This offset from the falling edge may provide a time buffer (e.g., a quarter of the period of the −I signal 132) for which the transition of the second adjusted sign selection signal 206 may be applied early or late (e.g., relative to the falling edge) and still be applied accurately (e.g., without generating the error pulse in the output 208 of the circuitry 200). Thus, the sign signal adjuster 202 causes the transition of the second adjusted sign selection signal 206 to occur when the −I signal 132 is a logic low (even when the transition of the second adjusted sign selection signal 206 occurs within one-fourth of the period of the −I signal 132 of a falling edge of the −I signal 132) to prevent an error pulse in the output 208 of the circuitry 200.

In this way, the transition of the sign selection signals 204, 206 can be shifted by about one-quarter of the period of the corresponding +I/−I signal 130, 132 with a margin of error of an additional one-quarter of the period of the +I/−I signal 130, 132, without causing an error pulse in the output 208. The transition of the sign selection signals 204, 206 is offset from the rising/falling edge of the respective +I/−I signal 130, 132, but occurs within one-half of the period of the respective +I/−I signal 130, 132 of the rising/falling edge. Accordingly, the sign signal adjuster 202 and the individual sign selection signals 204, 206 generated thereby enable a clean sign change of the output 208 without distortion or interference of an error pulse as discussed with respect to FIGS. 6B and 6C. The timing of the sign selection signals 204, 206 is discussed with respect to FIGS. 8A and 8B below.

Figure 8A:
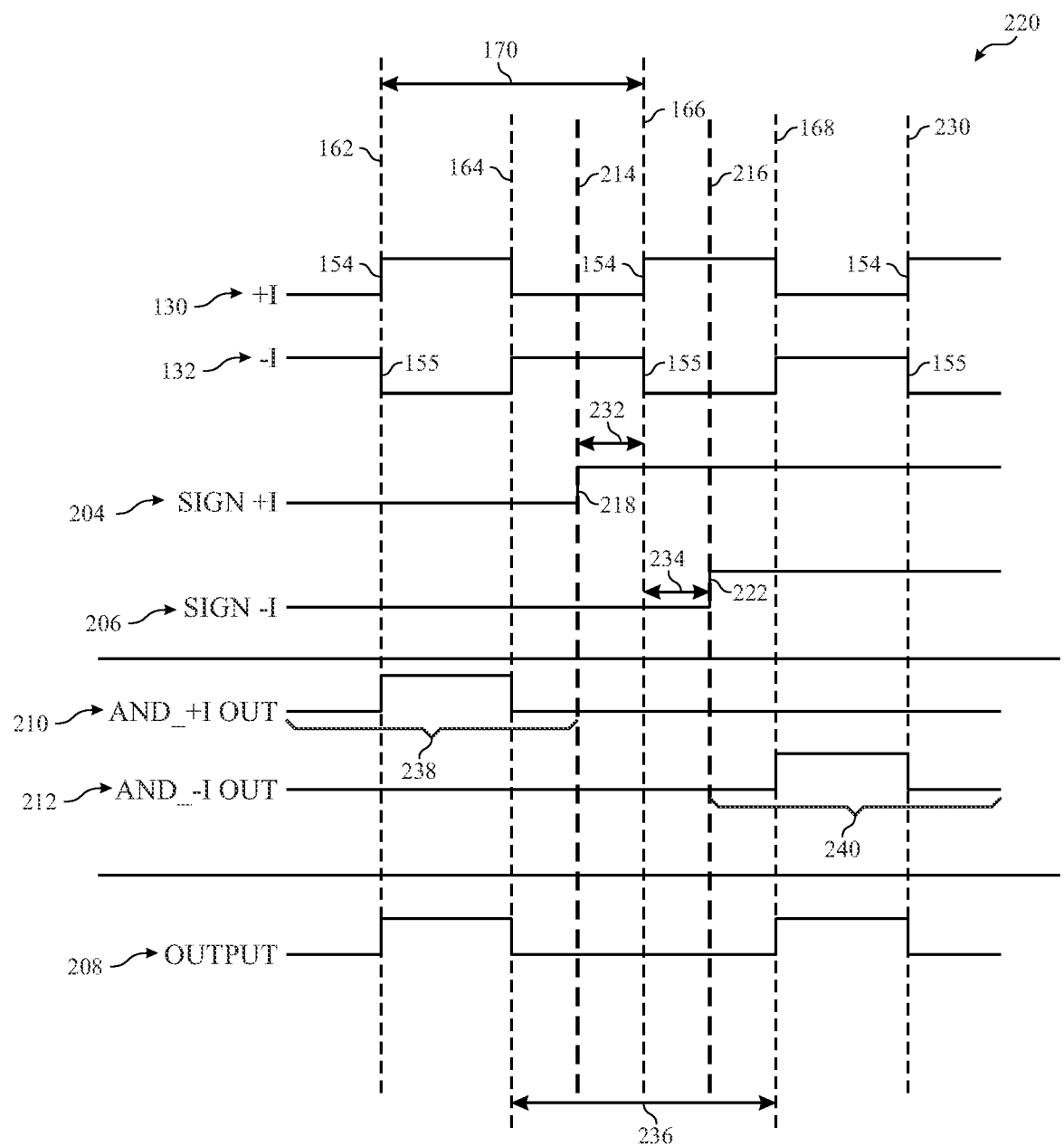
FIG. 8A is a timing diagram of a sign change operation from a positive in-phase signal to a negative in-phase signal (e.g., from +I to −I) that facilitates selecting an output signal to store in or for which to store an indication in the example sign selection signal circuitry of FIG. 7, according to an embodiment of the present disclosure.
Figure 8B:
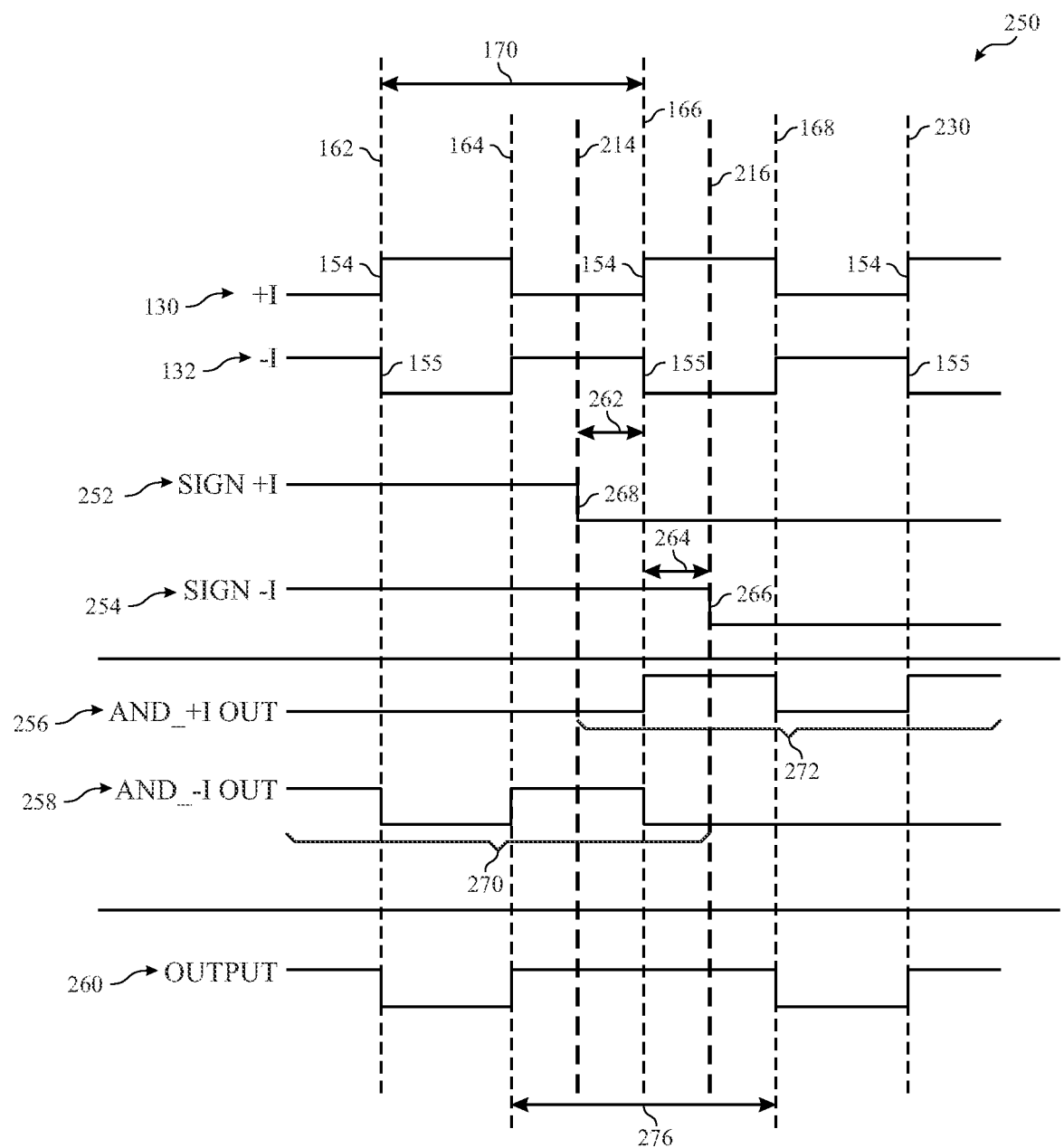
FIG. 8B is a timing diagram of a sign change operation from a negative in-phase signal to a positive in-phase signal (e.g., from −I to +I) that facilitates selecting an output signal to store in or for which to store an indication in the example sign selection signal circuitry of FIG. 7, according to an embodiment of the present disclosure.

FIGS. 8A and 8B are timing diagrams of sign change operations 220, 250 that facilitate selecting an output signal to store or for which to store an indication in the example sign selection signal circuitry 200 discussed with respect to FIG. 7, according to an embodiment of the present disclosure. The sign change operation 220 of FIG. 8A is a change of the polarity of the output 208 of the circuitry 200 of FIG. 7 from the +I signal 130 to the −I signal 132. The sign change operation 250 of FIG. 8B is a transition of the polarity of the output 208 of the circuitry 200 of FIG. 7 from the −I signal 132 to the +I signal 130.

While the sign change operations 220, 250 are directed to a sign change (e.g., transition) of the I signal, if should be understood that the same or similar techniques and processes can be used for a sign change of the Q signal discussed with respect to FIGS. 4A-4D. As discussed with respect to FIGS. 6A-6C, the +I signal 130 and the −I signal 132 have the same period 170. Further, a polarity of the −I signal 132 is opposite a polarity of the +I signal 130. That is, when the +I signal 130 is a logic high, the −I signal 132 is a logic low. In other words, the +I signal 130 may be considered to be 180 degrees out-of-phase with the −I signal 132. Thus, rising edges 154 of the +I signal 130 occur simultaneously with the falling edges 155 of the −I signal 132.

The +I signal 130 and the −I signal 132 transition from logic high to logic low or from logic high to logic low at a first transition 162, a second transition 164, a third transition 166, a fourth transition 168, and a fifth transition 230. Each of the transitions 162-168 and 230 occur at an edge or a midpoint of the period 170. A duration of time between each of the transitions (e.g., between 162 and 164, between 164 and 166, between 166 and 168, and between 168 and 230) is about one-half of the period 170.

The sign change operation 220 of FIG. 8A receives input signal +I 130, −I 132, and Sign_I 122, and generates an output signal 208 based on the operations discussed with respect to FIG. 7. A transition 218 of the Sign +I signal 204 from a logic low to a logic high occurs a time 232 before a rising edge 154 of the +I signal 130 as indicated by a bold line 214. That is, the transition 218 of the Sign +I signal 204 is advanced such that the transition 218 occurs before a rising edge 154 of the +I signal 130 (between the second transition 164 and the third transition 166). A transition 222 of the Sign −I signal 206 from the logic low to the logic high occurs a time 234 after a falling edge 155 of the −I signal 132, as indicated by a bold line 216. That is, the transition 222 of the Sign −I signal 206 is delayed such that the transition 222 occurs after a falling edge 155 of the −I signal 132 (between the third transition 166 and the fourth transition 168). A length of the times 232, 234 (e.g., offsets of the transitions 218, 222) may be between zero and one-half of the period 170 of the +I signal 130 and the −I signal 132, such as about one-fourth the period 170.

Before the transition 218 of the Sign +I signal 204 from the logic low to the logic high, an output 210 of the first AND gate 124 is the +I signal 130, shown as portion 238, due to the inverter 224. That is, the first AND gate 124 receives a logic high signal from the inverter 224 when the Sign +I signal 204 is the logic low. Once the Sign +I signal 204 transitions 218 to the logic high (e.g., the inverted Sign +I signal 204 transitions to the logic low), the output 210 of the first AND gate 124 is the logic low. Similarly, before the transition 222 of the Sign −I signal 206 from the logic low to the logic high, an output 212 of the second AND gate 126 is the logic low. Once the Sign −I signal 206 signal transitions 222 to the logic high, the output 212 of the second AND gate 126 is the −I signal 132, shown as portion 240.

The OR gate 134 receives the output 210 of the first AND gate 124 and the output 212 of the second AND gate 126. That is, an output 208 of the OR gate 134 is the output 208 of the circuitry 200 discussed with respect to FIG. 7. As illustrated, before the third transition 166, the output 208 of the circuitry 200 is the output 210 of the first AND gate 124. After the third transition 166, the output 208 is the output 212 of the second AND gate 126. That is, the output 208 is the +I signal 130 before the transition 218 of the Sign +I signal 204. The output 208 is the −I signal 132 after the transition 222 of the Sign −I signal 206. Thus, the output 208 is the logic low for the period 236 between the second transition 164 and the fourth transition 168. Advantageously, delaying the transition 222 of the Sign −I signal 206 to occur while the −I signal 132 is the logic low between the third transition 164 and the fourth transition 168 prevents or substantially reduces an occurrence of the error pulse discussed above with respect to FIGS. 6B and 6C. That is, by enabling the transition 222 of the Sign −I signal 206 to occur when the −I signal 132 is the logic low, the sign signal adjuster 202 reduces the occurrence of the error pulse in the output 212 of the second AND gate 126 (and thus the output 208 of the circuitry 200) discussed above.

Input and output signals of the sign change operation 250 in FIG. 8B are similar to those of the sign change operation 220 of FIG. 8A. However, transitions of the Sign +I signal 252 and the Sign −I signal 254, corresponding to the Sign +I signal 204 and the Sign −I signal 206 of FIG. 8A, respectively, occur at different times due to the offset applied by the sign signal adjuster 202. Further, outputs 256, 258, 260 of the first AND gate 124, the second AND gate 126, and the circuitry 200 are different because of the transition from the −I signal 132 to the +I signal 130.

A transition 268 of the Sign +I signal 252 from a logic high to a logic low occurs a time 262 before a rising edge 154 of the +I signal 130 at the third transition 166, as indicated by the bold line 214. That is, the transition 268 of the Sign +I signal 252 is advanced from the third transition 166 such that the transition 268 occurs before a rising edge 154 of the +I signal 130 between the second transition 164 and the third transition 166 by the time 262. A transition 266 of the Sign −I signal 254 from a logic high to a logic low occurs a time 264 after a falling edge 155 of the −I signal 132 at the third transition 166, as indicated by the bold line 216. That is, the transition 266 of the Sign −I signal 254 is delayed from the third transition 166 such that the transition 266 occurs after a falling edge 155 of the −I signal 132 between the third transition 166 and the fourth transition 168 by the time 264. A length of the times 262, 264 may be between zero and one-half of the period 170 of the +I signal 130 and the −I signal 132, such as about one-fourth the period 170.

Before the transition 268 of the Sign +I signal 252 indicated by the bold line 214, the output 256 of the first AND gate 124 is the logic low due to the inverter 224. That is, the first AND gate 124 receives a logic low signal from the inverter 224 when the Sign +I signal 252 is the logic high. After the Sign +I signal 252 transitions 268 to the logic low at the bold line 214 (e.g., the inverted Sign +I signal 252 transitions to the logic high), the output 256 of the first AND gate 124 is the +I signal 130, shown as portion 272. Similarly, before the transition 266 of the Sign −I signal 254, the output 258 of the second AND gate 126 is the −I signal 132, shown as portion 270. After the Sign −I signal 254 transitions 266 to the logic low, the output 258 is the logic low.

The OR gate 134 receives the output 256 of the first AND gate 124 and the output 258 of the second AND gate 126. An output 260 of the OR gate 134 is the output 208 of the circuitry 200 discussed with respect to FIG. 7. As illustrated, before the third transition 166 the output 208, 260 of the circuitry 200 is the output 210 of the first AND gate 124. After the third transition 166, the output 208, 260 is the output 256 of the second AND gate 126. That is, the output 208, 260 is the −I signal 132 before the third transition 166. The output 208, 260 is the +I signal 130 after the third transition 166. Thus, the output 208, 260 is the logic high for the period 276 between the second transition 164 and the fourth transition 168. Advantageously, advancing the transition 268 of the Sign +I signal 252 to occur while the +I signal 130 is the logic low and before the rising edge 154 of the +I signal 130 at the third transition 166 by the time 262, prevents or substantially reduces an occurrence of the error pulse discussed above with respect to FIGS. 6B and 6C. That is, by enabling the transition 268 of the Sign +I signal 252 to occur when the +I signal 130 is the logic low, the sign signal adjuster 202 reduces the occurrence of the error pulse in the output 256 of the first AND gate 124 (and thus the output 208, 260 of the circuitry 200) discussed above.

Figure 9A:
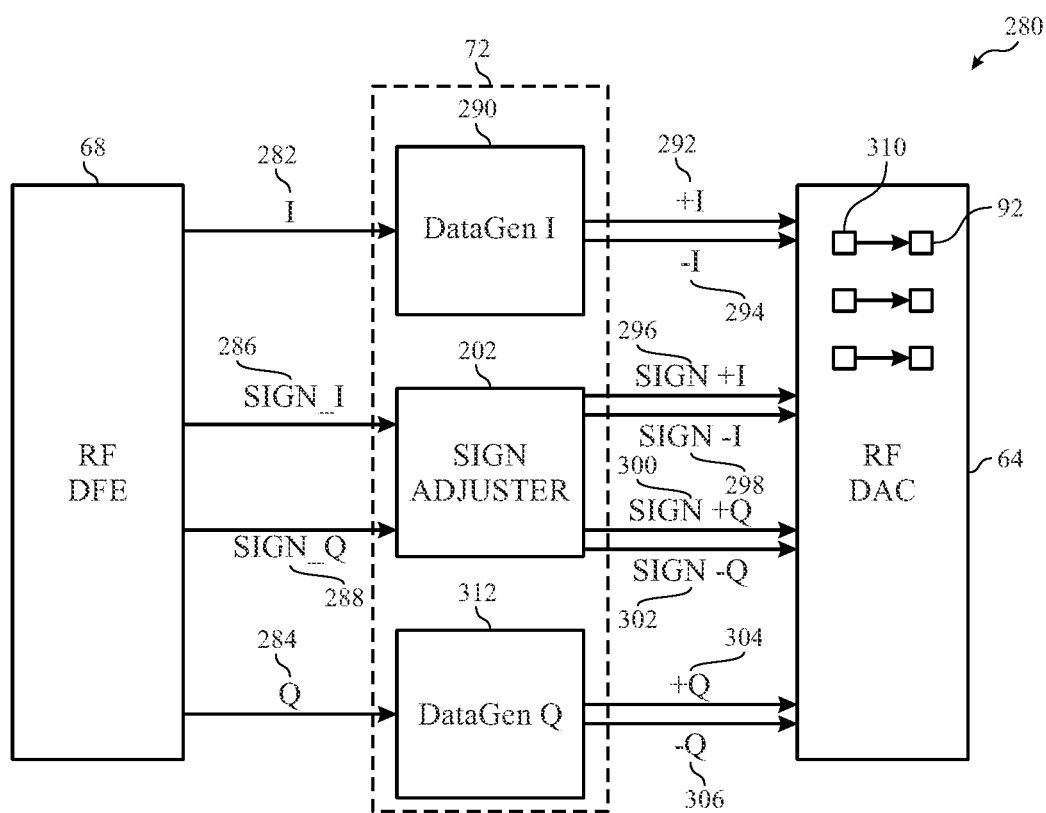
FIG. 9A is a schematic diagram illustrating example signal selection circuitry coupled to storage cells of the RF DAC of FIGS. 3 and 4A, according to an embodiment of the present disclosure.

FIG. 9A is a schematic diagram illustrating example signal selection circuitry 280 coupled to storage cells of the RF DAC of FIGS. 3 and 4A, according to an embodiment of the present disclosure. As discussed above, the RF DFE 68 may receive an input signal from a digital front-end DFE 66 including quadrature (e.g., I and Q) component signals of, for example, a baseband signal. The RF DFE 68 may change (e.g., increase) a frequency of the quadrature (e.g., I/Q signals to generate adjusted data signals, I 282 and Data_Q 284 (e.g., having radio frequencies). The RF DFE 68 may provide the adjusted data signals 282, 284 to the signal selection circuitry 72.

The RF DFE 68 may also generate and provide one or more sign selection signals 286, 288 to the signal selection circuitry 72. As discussed above, the sign selection signals 286, 288 may indicate when a polarity of an output of the RF DAC 64 or a signal stored in or for which an indication is stored in a particular cell 92 of the RF DAC 64 is to transition between a positive and a negative quadrature (e.g., I/Q signal. The RF DFE 68 provides the sign selection signals 286, 288 and respective data signals 282, 284 to the signal selection circuitry 72. For example, the RF DFE 68 may provide a I signal 282, a Data_Q signal 284, and the respective sign selection signals, Sign_I 286 and Sign_Q 288, to the signal selection circuitry 72.

The data generators 290, 312 (e.g., signal generators) of the signal selection circuitry 72 receive the respective data signals 282, 284. For example, a first data generator Data-Gen I 290 may receive the I signal 282 and a second data generator DataGen Q 312 may receive the Data_Q signal 284. The data generators 290, 312 may generate a positive and negative polarity signal corresponding to and based on the respective quadrature signal (e.g., I or Q) from the RF DFE 68. For example, the first data generator 290 may generate a positive polarity data signal +I 292 and a negative polarity data signal −I 294 based on the I signal 282 from the RF DFE 68. Similarly, the second data generator 312 may generate the a positive polarity data signal +Q 304 and a negative polarity data signal −Q 306 based on the Data_Q signal 284 from the RF DFE 68. The positive and negative polarity I data signals, +I 292 and −I 294, may correspond to the +I and −I signals, 130 and 132, respectively, discussed with respect to 5-8B.

The sign signal adjuster 202 may receive a sign signal for each data signal 282, 284 from the RF DFE 68. That is, the sign signal adjuster 202 receives a first sign signal Sign_I 286 corresponding to the I signal 282 and a second sign signal Sign_Q 288 corresponding to the Data_Q signal 284. The sign signal adjuster 202 may generate and/or adjust a timing of the Sign_I selection signal 286. That is, the sign signal adjuster 202 may generate one or more sign selection signals for each quadrature signal (e.g., the I signal and the Q signal). For example, sign signal adjuster 202 may generate a Sign +I signal 296 and a Sign −I signal 298 based on the Sign_I signal 286 from the RF DFE 68. Similarly, the sign signal adjuster 202 may generate a Sign +Q signal 300 and a Sign −Q signal 302 based on the Sign_Q signal 288 from the RF DFE 68.

The sign signal adjuster 202 may apply a time offset to each of the sign selection signals 296, 298, 300, 302 such that a transition of the sign selection signals 296, 298, 300, 302 (e.g., between a logic low and a logic high) occurs within about one half of a period of the respective data signal 292, 294, 304, 306 of a transition (e.g., a rising or falling edge) of the respective data signal 292, 294, 304, 306.

Further, the sign signal adjuster 202 may adjust the time offset such that the transition of the sign selection signals 296, 298, 300, 302 occurs between transitions (e.g., rising or falling edges) of the respective data signals 292, 294, 304, 306 while the respective data signal 292, 294, 304, 306 is a logic low. In this way, the sign signal adjuster 202 may reduce or substantially eliminate an occurrence of a signal pulse in an output of the RF DAC 64, resulting in an improved output power of the transmitter 52 and an improved sensitivity of a receiver that receives the output signal of the transmitter 52.

It should be understood that the signal selection circuitry 72 may include different or additional components than illustrated. For example, while a single sign signal adjuster 202 is shown for generating the adjusted sign selection signals 296, 298, 300, 302 for the quadrature signals (e.g., I/Q) 292, 294, 304, 306, it should be understood that one or more sign signal adjusters may be used to generate respective adjusted sign selection signals for each of the quadrature signals (e.g., I/Q). For example a first sign signal adjuster may generate and/or adjust sign selection signals for the I quadrature signal while a second selection sign signal adjuster may generate and/or adjust sign selection signals for the Q quadrature signals. Further, while separate data generators 290, 312 are shown for generating the positive and negative polarity data signals 292, 294, 304, 306, it should be understood that the signal selection circuitry may include a single data generator to generate the data signals 292, 294, 304, 306.

The signal selection circuitry 72 may provide the positive and negative polarity data signals 292, 294, 304, 306 and the adjusted sign selection signals 296, 298, 300, 302 to the RF DAC 64. In particular, these signals may be received by cell circuitry 310 for each cell 92 of the RF DAC 64. That is, the RF DAC 64 may include cell circuitry 310 for each cell 92 thereof. The cell circuitry 310 is discussed with respect to FIG. 9B below. It should be understood that while a single sign signal adjuster 202 provides adjusted sign signals to each cell 92 of the RF DAC 64 in FIG. 9A, the signal selection circuitry 72 may include one sign signal adjuster 202 per cell 92 of the RF DAC 64 or per subset of cells 92, such as a row 94 or column 95 of the RF DAC 64.

Figure 9B:
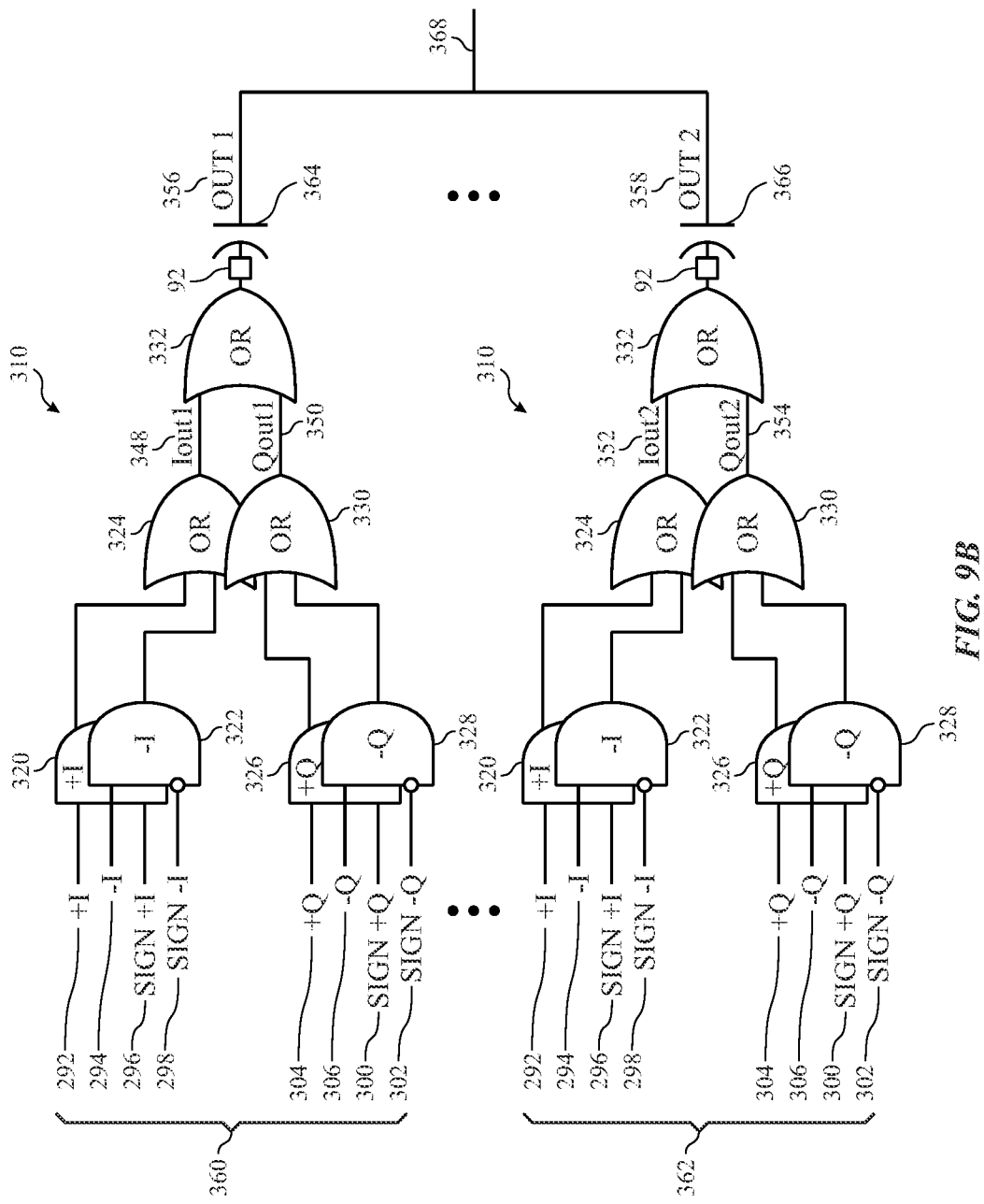
FIG. 9B is a schematic diagram illustrating example cell circuitry for each storage cell of the RF DAC of FIG. 4A, according to an embodiment of the present disclosure.

FIG. 9B is a schematic diagram illustrating example cell circuitry 310 of the RF DAC 64 of FIGS. 3, 4A, and 9A, according to an embodiment of the present disclosure. The cell circuitry 310 may select and provide a positive or negative (e.g., + or −) quadrature signal (e.g., I or Q) to be stored or for which to store an indication of in a particular cell 92 of the RF DAC 64. Each cell circuitry 310 may receive the positive and negative polarity data signals 292, 294, 304, 306 and the adjusted sign selection signals 296, 298, 300, 302 from the signal selection circuitry 72.

Each cell circuitry 310 may include a number of logic AND gates 320, 322, 326, 328 and a number of logic OR gates 324, 330, 332 and may correspond to the circuitry 200 of FIG. 7. For example, the AND gates 320 and 322 of a first cell circuitry 360 may correspond to the AND gates 124 and 126, respectively, and the OR gate 324 may correspond to the OR gate 134 of the circuitry 200. A first logic AND gate 320, a second logic AND gate 322, and a first logic OR gate 324 of the first cell circuitry 360 may correspond to the in-phase (e.g., I) quadrature signal. That is, the first logic AND gate 320 receives the positive in-phase signal +I 292 and the Sign +I signal 296 from the signal selection circuitry 72. The first logic AND gate 320 performs an AND operation such that when the Sign +I signal 292 is the logic high, the output of the first logic AND gate 320 is the +I signal 292.

Similarly, the second logic AND gate 322 receives the negative in-phase signal −I 294 and the Sign −I signal 298. The second logic AND gate 322 performs an AND operation such that when the Sign −I signal 298 is the logic low, the output of the second logic AND gate 322 is the −I signal 294. It should be noted that the Sign −I signal 298 is inverted at the input of the second logic AND gate 322. However, in some embodiments, the Sign −I signal 298 is not inverted at the input of the second logic AND gate 322. In that case, the output of the second logic AND gate 322 is the −I signal when the Sign −I signal is the logic high.

A third logic AND gate 326 and a fourth logic AND gate 328 of the first cell circuitry 360 operate similar to the first and second logic AND gates 320, 322, except those gates output the corresponding +Q signal 304 or −Q signal 306, respectively. The first logic OR gate 324 receives and performs an OR operation on the outputs of the first and second logic AND gates 320, 322. That is, the output Iout1 348 of the first logic OR gate 324 is the +I signal 292 or the −I signal 294, based on the logic high (or low) values of the Sign +I signal 296 and the Sign −I signal 298. Similarly, a second logic OR gate performs an OR operation on the outputs of the third and fourth logic AND gates 326, 328. The output Qout1 350 of the second logic OR gate 330 is the +Q signal 304 or the −Q signal 306, based on the logic high/low values of the Sign +Q signal 300 and the Sign −Q signal 302.

A third logic OR gate 332 of the first cell circuitry 360 performs an OR operation on the outputs Iout1 348 and Qout1 350 such that the output 356 of the first cell circuitry 360 is the positive or negative quadrature signals (e.g., I or Q) 292, 294, 304, or 306 based on the logic high (or low) values of the sign selection signals 296, 298, 300, 302. An output 356 of the third logic OR gate 332 is the output of the first cell circuitry 360 and provides a signal to store or for which an indication to store in the corresponding cell 92 of the RF DAC 64. A second cell circuitry 362 of the cell circuitry 310 may operate substantially similar to the first cell circuitry 360 and provide an output signal 358 to a corresponding cell 92 of the RF DAC 64.

In some embodiments, the RF DAC 64 may include a capacitor 364, 366 for each cell circuitry 310. Each capacitor 364, 366 may receive an output of a respective cell 92. In some embodiments, the output signal of the cells 92 through the capacitors 364, 366 may be combined within the RF DAC 64 to generate an output 368 of the RF DAC 64. That is, the RF DAC 64 may combine (e.g., aggregate or sum) multiple I and/or Q signals stored in or for which an indication is stored in multiple cells 92. The RF DAC 64 may provide the output signal 368 of the RF DAC to the matching network 74.

The sign signal adjuster 202 ensures that a transition between polarities of a particular quadrature signal (e.g., between the +I signal 292 and the −I signal 294 or between the +Q signal 304 and the −Q signal 306) for a particular cell 92 of the RF DAC 64 occurs when a respective target quadrature signal (e.g., +I, −I, +Q, or −Q) is a logic low and within one half of a period of the respective target quadrature signal of a rising or falling edge of the target quadrature signal. That is, the sign signal adjuster 202 causes the transition of the sign selection signals 296, 298 to occur such that an error pulse in the outputs 356, 358 is prevented.

Figure 10A:
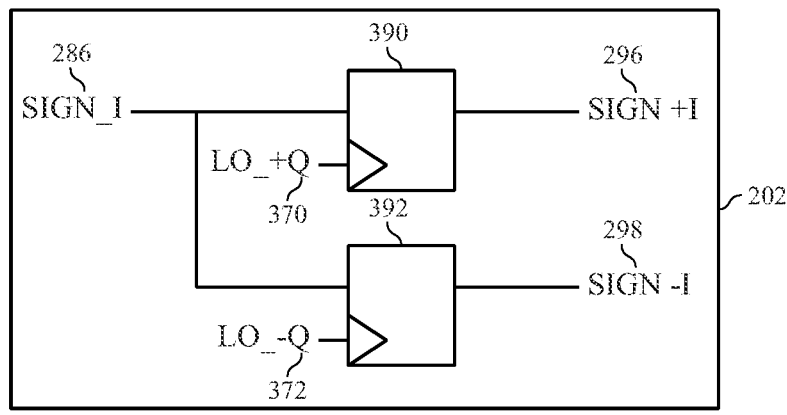
FIG. 10A is a block diagram of a sign signal adjuster of the signal selection signal circuitry of the RF DAC of FIG. 3, according to an embodiment of the present disclosure.

FIG. 10A is a block diagram of a sign signal adjuster 202 of the signal selection circuitry 72 of the RF DAC 64 of FIG. 3, according to an embodiment of the present disclosure. To generate (e.g., adjust) the sign selection signals 296, 298 discussed above, the sign signal adjuster 202 includes one or more clocking components (e.g., latches, flip-flops, or the like) 390, 392.

In particular, the clocking component 390 may receive the sign selection signal 286 from the RF DFE 68 and the LO_+Q signal 370 from the local oscillators 70 of FIG. 3. The clocking component 390 may generate the Sign +I signal 296 by clocking the sign selection signal 286 with the LO_+Q signal 370. Because the LO_+Q signal 370 (e.g., the +Q signal 104 of FIG. 4D) is a quarter of a period behind (e.g., phase-shifted with respect to) the LO_+I signal (e.g., the +I signal 108 of FIG. 4D), the clocking component 390 may generate the Sign +I signal 296 as transitioning a quarter of a period behind (e.g., phase-shifted with respect to) the LO_+I signal. This may enable increasing and/or maximizing the time margin associated with the Sign +I signal 296 (e.g., the time margin 232 shown in FIG. 8A and the time margin 262 shown in FIG. 8B).

Similarly, the clocking component 392 may receive the sign selection signal 286 from the RF DFE 68 and the LO_−Q signal 372 from the local oscillators 70 of FIG. 3. The clocking component 392 may generate the Sign −I signal 298 by clocking the sign selection signal 286 with the LO_−Q signal 372. Because the LO_−Q signal 372 (e.g., the −Q signal 106 of FIG. 4D) is a quarter of a period behind (e.g., phase-shifted with respect to) the LO_−I signal (e.g., the −I signal 110 of FIG. 4D), the clocking component 392 may generate the Sign −I signal 298 as transitioning a quarter of a period behind (e.g., phase-shifted with respect to) the LO_−I signal. This may enable increasing and/or maximizing the time margin associated with the Sign −I signal 298 (e.g., the time margin 234 shown in FIG. 8A and the time margin 265 shown in FIG. 8B).

It should be understood that there may be clocking components for generating Sign +Q and Sign −Q signals similar to the clocking components 390, 392. To generate the Sign +Q signal as transitioning a quarter of a period behind (e.g., phase-shifted with respect to) the LO_+Q signal 370, a respective clocking component may clock the Sign Q signal with the LO_−I signal (e.g., the −I signal 110 of FIG. 4D), which is a quarter of a period behind (e.g., phase-shifted with respect to) the LO_+Q signal 370 (e.g., the +Q signal 104 of FIG. 4D). This may enable increasing and/or maximizing the time margin associated with the Sign +Q signal.

Similarly, to generate the Sign −Q signal as transitioning a quarter of a period behind (e.g., phase-shifted with respect to) the LO_−Q signal 372, a respective clocking component may clock the Sign Q signal with the LO_+I signal (e.g., the +I signal 108 of FIG. 4D), which is a quarter of a period behind (e.g., phase-shifted with respect to) the LO_−Q signal 372 (e.g., the −Q signal 106 of FIG. 4D). This may enable increasing and/or maximizing the time margins associated with the Sign −Q signal.

Figure 10B:
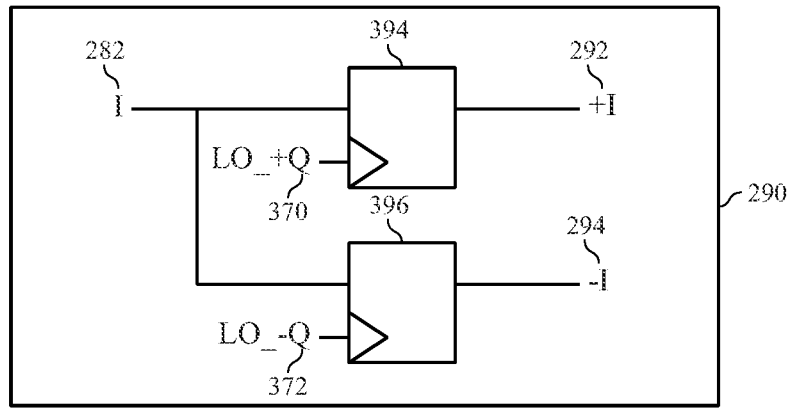
FIG. 10B is a block diagram of a data signal generator of the signal selection circuitry of the RF DAC of FIG. 3, according to an embodiment of the present disclosure.

FIG. 10B is a block diagram of a data signal generator 290 of the signal selection circuitry 72 of the RF DAC 64 of FIG. 3, according to an embodiment of the present disclosure. The data signal generator 290 may generate the positive polarity +I signal 292 and the negative polarity −I signal 294 based on the I signal 282 from the RF DFE 68.

Similar to the clocking component 390 of FIG. 10A above, the clocking component 394 may receive the I signal 282 from the RF DFE 68 and the LO_+Q signal 370 from the local oscillators 70 of FIG. 3. The clocking component 390 may generate the +I signal 292 by clocking the I signal 282 with the LO_+Q signal 370. Because the LO_+Q signal 370 (e.g., the +Q signal 104 of FIG. 4D) is a quarter of a period behind (e.g., phase-shifted with respect to) the LO_+I signal (e.g., the +I signal 108 of FIG. 4D), the clocking component 390 may generate the +I signal 292 as transitioning a quarter of a period behind (e.g., phase-shifted with respect to) the LO_+I signal. This may enable increasing and/or maximizing the time margin associated with the +I signal 292 (e.g., the time margin 232 shown in FIG. 8A and the time margin 262 shown in FIG. 8B).

Similarly, the clocking component 396 may receive the I signal 282 from the RF DFE 68 and the LO_-Q signal 372 from the local oscillators 70 of FIG. 3. The clocking component 392 may generate the -I signal 294 by clocking the I signal 282 with the LO_-Q signal 372. Because the LO_-Q signal 372 (e.g., the -Q signal 106 of FIG. 4D) is a quarter of a period behind (e.g., phase-shifted with respect to) the LO_-I signal (e.g., the -I signal 110 of FIG. 4D), the clocking component 392 may generate the -I signal 294 as transitioning a quarter of a period behind (e.g., phase-shifted with respect to) the LO_-I signal. This may enable increasing and/or maximizing the time margin associated with the -I signal 294 (e.g., the time margin 234 shown in FIG. 8A and the time margin 265 shown in FIG. 8B).

It should be understood that there may be clocking components for generating +Q and -Q signals similar to the clocking components 390, 392. To generate the +Q signal as transitioning a quarter of a period behind (e.g., phase-shifted with respect to) the LO_+Q signal 370, a respective clocking component may clock the Q signal with the LO_-I signal (e.g., the -I signal 110 of FIG. 4D), which is a quarter of a period behind (e.g., phase-shifted with respect to) the LO_+Q signal 370 (e.g., the +Q signal 104 of FIG. 4D). This may enable increasing and/or maximizing the time margin associated with the +Q signal.

Similarly, to generate the -Q signal as transitioning a quarter of a period behind (e.g., phase-shifted with respect to) the LO_-Q signal 372, a respective clocking component may clock the Q signal with the LO_+I signal (e.g., the +I signal 108 of FIG. 4D), which is a quarter of a period behind (e.g., phase-shifted with respect to) the LO_-Q signal 372 (e.g., the -Q signal 106 of FIG. 4D). This may enable increasing and/or maximizing the time margin associated with the -Q signal.

Figure 11:
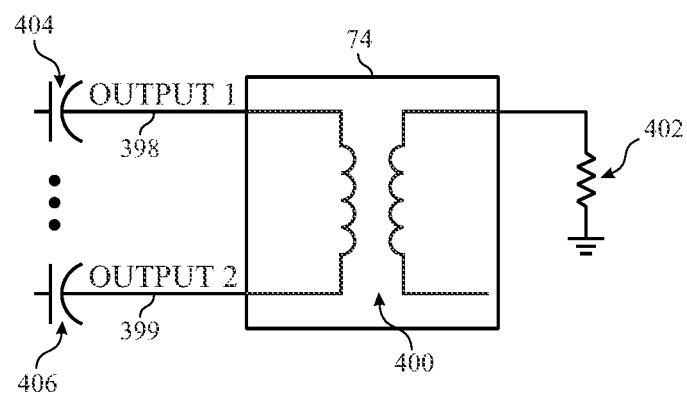
FIG. 11 is a circuit diagram of a matching network of a transmission circuit discussed with respect to FIG. 3, according to an embodiment of the present disclosure.

FIG. 11 is a circuit diagram of a matching network 74 of the transmission circuit 52 discussed with respect to FIG. 3, according to an embodiment of the present disclosure. As shown, the matching network 74 may receive a number of outputs 398, 399 from the cell circuitry 310 of FIGS. 9A and 9B. The matching network 74 may be an impedance matching network. For example, as shown, the matching network 74 may include an impedance transformer 400 configured to balance an impedance of the outputs 398, 399 of the RF DAC 64 with an impedance of the one or more antennas 55 of the electronic device 10 to maintain the power output of the transmitter 52. In some embodiments, the matching network 74 may combine (e.g., aggregate) one or more I and/or Q signals 398, 399 output by the RF DAC 64 and to be output by the TX circuit 52 and transmitted by the one or more antennas 55. One or more capacitors 404, 406 may be disposed between the RF DAC 64 and the matching network 74. In some embodiments, the capacitors 404, 406 may correspond to (e.g., include) the capacitors 364, 366 of FIG. 9B, and thus may be disposed in the RF DAC 64. That is, the capacitors 404, 406 may be part of and disposed in the RF DAC 64. Accordingly, in such embodiments, the RF DAC 64 (e.g., via the capacitors 404, 406) may combine (e.g., aggregate) the one or more I and/or Q signals 398, 399.

Figure 12:
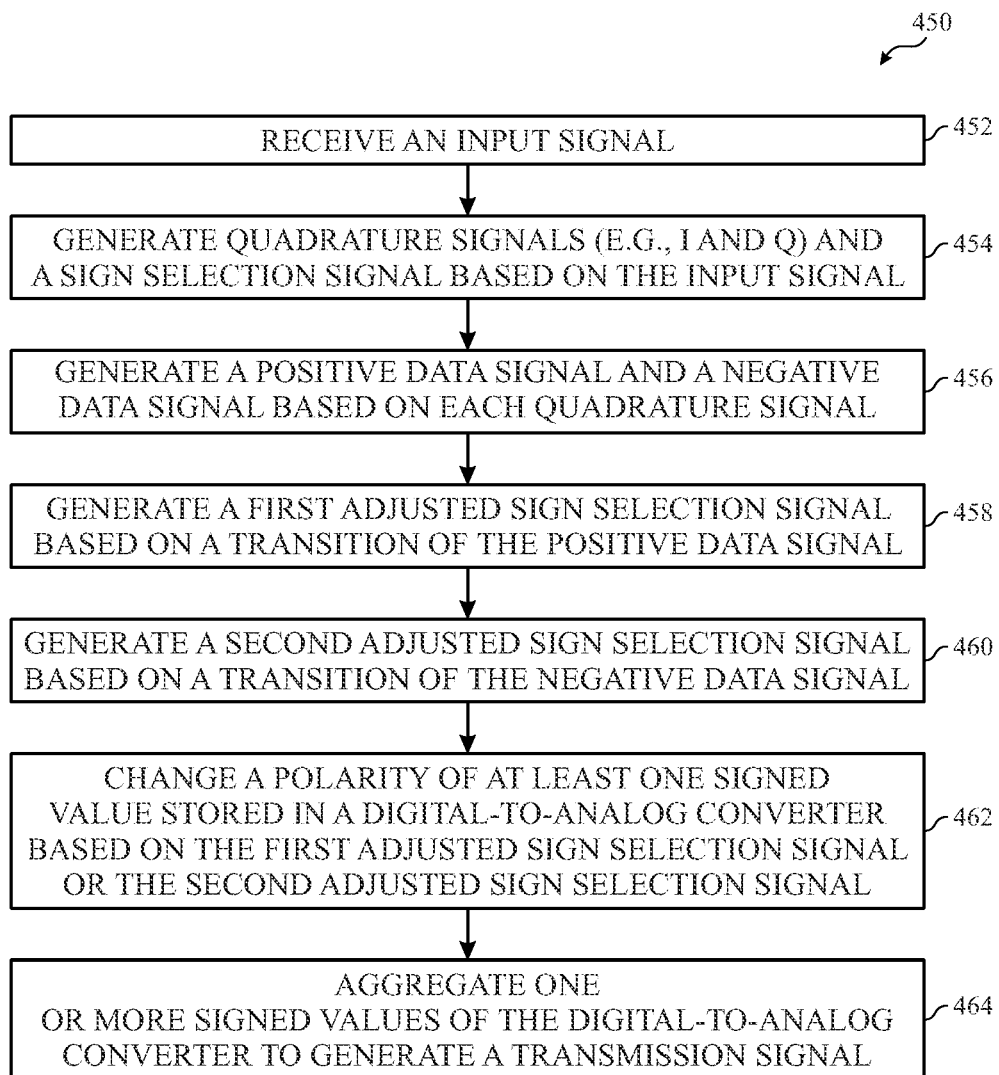
FIG. 12 is a flowchart illustrating operations of a polarity change of a value stored in a cell of the RF DAC of FIG. 3, according to an embodiment of the present disclosure.

FIG. 12 is a flowchart illustrating operations 450 of a polarity change of a value stored in or for which to store an indication in a cell 92 of the RF DAC 64 of FIG. 3, according to an embodiment of the present disclosure. The operations 450 may be executed by one or more components of an electronic device and/or a transmitter of an electronic device, such as the electronic device 10 and the transmitter 52 discussed above. For example, the operations 450 may be executed by the one or more processors 12 and cause the transmitter 52 to output a signal to be transmitted via the one or more antennas 55. It should be understood that, while the operations 450 are shown in a specific sequence, the operations 450 may be implemented in any suitable order, and at least some operations 450 may be skipped altogether.

The operations 450 begin at operation 452 where the processor 12 causes the signal selection circuitry 72 to receive an input signal. The input signal may include one or more quadrature signals (e.g., I and/or Q signals) and a sign selection signal for each of the quadrature signals. For example, as discussed with respect to FIG. 9A, the signal selection circuitry 72 receives the data signals 282, 284 and the corresponding sign selection signals 286, 288, respectively.

At operation 454, the processor 12 causes a radio frequency digital front end, such as the RF DFE 68 of FIGS. 3 and 9A, to generate quadrature (e.g., I and Q) component signals based on the input signal, such as the I and Data_Q signals 282, 284 of FIG. 9A. The RF DFE 689 also generates a sign selection signal which indicates when to switch between a positive polarity and a negative polarity quadrature (e.g., I or Q) signal.

While the operations below relate to a sign change operation of the in-phase (e.g., I) component of the input signal, it should be understood that the same operation may be used for a sign change operation of the quadrature (e.g., Q) component of the input signal. At operation 456, the processor 12 causes signal selection circuitry of the transmitter 52, such as the signal selection circuitry 72, to generate a positive in-phase signal (e.g., +I) and a negative in-phase signal (e.g., -I) based on the input signal. For example, the signal selection circuitry 72 may include one or more data generators, such as the data generators 290, 312 of FIGS. 9A and 9B. The data generators may generate a positive and negative polarity signal corresponding to and based on the in-phase component signal (e.g., I) from the RF DFE 68.

At operation 458, the processor 12 causes a sign adjuster of the signal selection circuitry, such as the sign adjuster 202 of FIGS. 9A and 9B, to generate and/or adjust a first adjusted sign selection signal based on a transition of the positive in-phase signal (e.g., +I). The sign adjuster may ensure that the transition of the adjusted sign selection signal (e.g., between a logic high and a logic low) occurs when the +I signal is a logic low and within one half of a period of the +I signal of a rising edge of the +I signal.

At operation 460, the processor 12 causes the sign adjuster 202 of the signal selection circuitry to generate and/or adjust a second adjusted sign selection signal based on a transition of the negative in-phase signal (e.g., -I). The sign adjuster may ensure that the transition of the adjusted sign selection signal (e.g., between a logic high and a logic low) occurs when the -I signal is a logic low and within one half of a period of the -I signal of a falling edge of the -I signal.

By ensuring the transitions of the adjusted sign selection signals occur when the respective polarity I signal is the logic low and within one half of a period of the respective polarity I signal of a rising/falling edge, the sign adjuster substantially reduces an occurrence of an error pulse in the output of the transmitter, thereby improving a power output of the transmitter and a sensitivity of a receiver which receives an output signal of the transmitter.

At operation 462, the processor 12 causes an RF DAC 64 to change a polarity of at least one signed value (e.g., indicating a quadrature component signal and/or associated with a quadrature component signal) stored in a particular cell 92 of the RF DAC 64 based on the first adjusted sign selection signal or the second adjusted sign selection signal. For example, the first or second adjusted sign selection signals generated in operations 458 and 460 may be applied to cell circuitry (such as the cell circuitry 310 of FIGS. 9A and 9B) to change a polarity of the signed value signal to be stored in the particular cell 92.

At operation 464, the processor 12 causes the RF DAC 64 (and/or the matching network 74 of the transmitter 52) to generate a transmission signal to be output by the transmitter 52 and transmitted via one or more antennas 55. To do so, the RF DAC 64 aggregates one or more signed values stored or for which an indication is stored in one or more cells 92 of the RF DAC 64.

Figure 13:
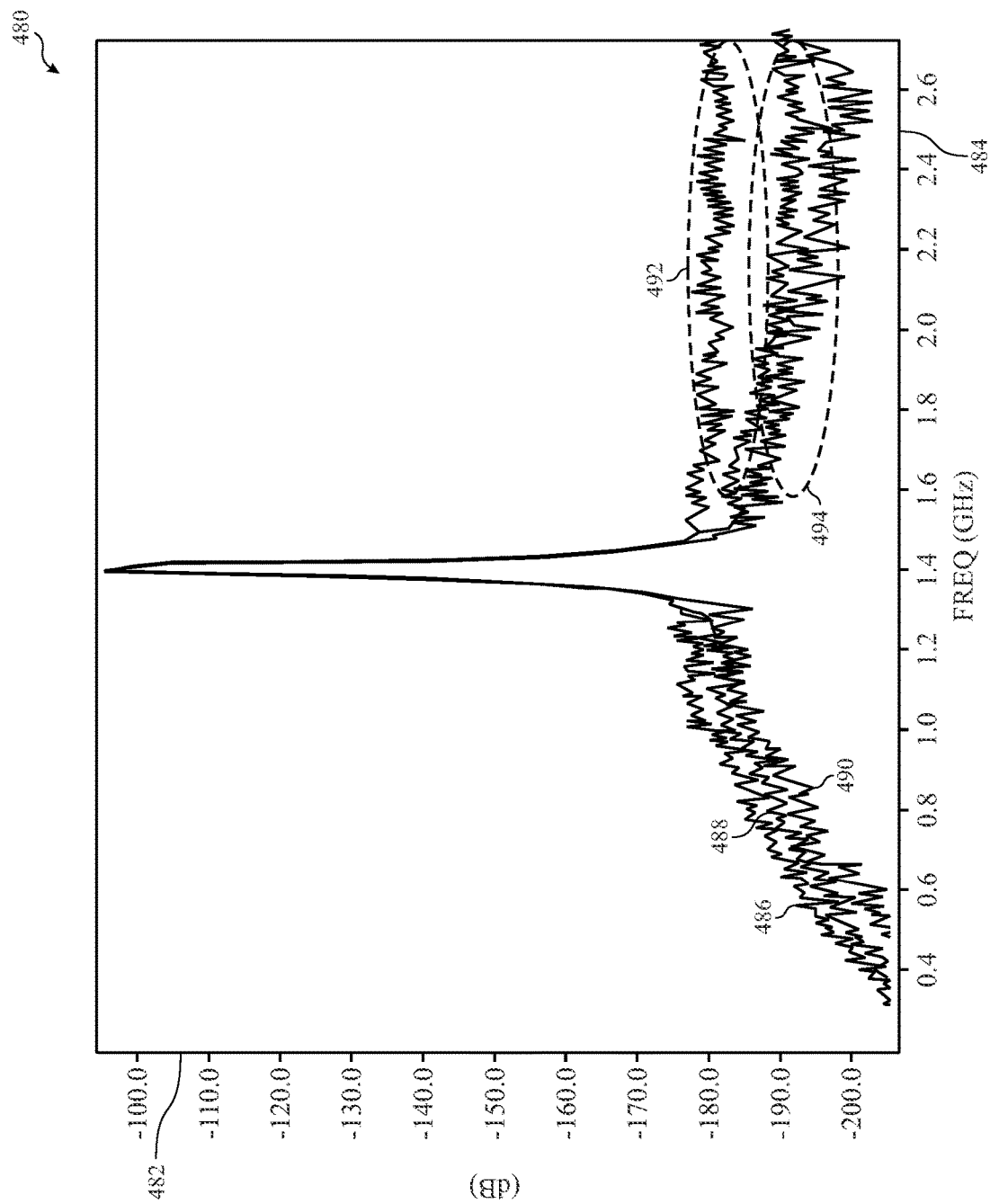
FIG. 13 is a graph illustrating an output of a transmitter of the electronic device of FIG. 1, according to an embodiment of the present disclosure.

FIG. 13 is a graph 480 illustrating an output of a transmitter 52 of the electronic device 10 of FIG. 1, according to an embodiment of the present disclosure. The graph 480 shows (1) a first transmission output signal 486 when the transmitter 52 does not include the sign adjuster 202 discussed with respect to FIGS. 7-11, (2) a second transmission output signal 488 when the transmitter 52 includes the signal selection circuitry 72, and (3) a third transmission output signal 490 when without a timing misalignment of the sign selection signal(s) (e.g., an ideal case). As shown, when the transmitter 52 does not include the signal selection circuitry 72, the first transmission output signal 486 has a higher noise ratio (e.g., is farther from the third transmission output signal 490) due to the timing mismatch of the sign selection signal and lack of correction.

Conversely, when the transmitter 52 includes the signal selection circuitry 72, the second transmission output signal 488 has a lower noise ratio (e.g., is closer to the third transmission output signal 490). As an example, the signal selection circuitry 72 may improve the signal to noise ratio of the output of the transmitter by between about 5 dB and about 20 dB, such as about 10 dB. In other words, the signal selection circuitry 72 may improve the signal to noise ratio by about 10 percent. Advantageously, the signal selection circuitry 72 improve the signal to noise ratio of the transmission output signal of the transmitter by ensuring an accurate transition between polarities of a quadrature signal (e.g., I or Q) stored in or for which an indication is stored in a cell 92 of an RF DAC 64. The improved signal to noise ratio results in an improved power output of the transmitter and improving a sensitivity of a receiver which receives the output signal of the transmitter.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electronic device, comprising:
one or more antennas; and
transmit circuitry configured to send a transmission signal to the one or more antennas, the transmit circuitry comprising:
a digital front end configured to receive an input signal and generate a positive data signal, a negative data signal, and a sign selection signal based on the input signal;
sign selection adjusting circuitry operatively coupled to the digital front end, the sign selection adjusting circuitry configured to receive the sign selection signal and generate a first adjusted sign selection signal based on a transition of the positive data signal and a second adjusted sign selection signal based on a transition of the negative data signal; and
a digital-to-analog converter operatively coupled to the sign selection adjusting circuitry and configured to receive the first adjusted sign selection signal and the second adjusted sign selection signal, the digital-to-analog converter configured to store a plurality of signed values related to the positive data signal and the negative data signal, change a polarity of at least one previously stored signed value of the plurality of signed values based on the first adjusted sign selection signal or the second adjusted sign selection signal, and generate the transmission signal by aggregating the plurality of signed values to improve signal quality of the transmission signal.

2. The electronic device of claim 1, wherein the transition of the positive data signal is between a first value and a second value of the first adjusted sign selection signal, and wherein the transition of the negative data signal is between the first value and the second value of the second adjusted sign selection signal, the second value being lower than the first value.

3. The electronic device of claim 2, wherein a transition of the first adjusted sign selection signal occurs within one-fourth of a period of the positive data signal offset from a rising edge of the positive data signal, and wherein a transition of the second adjusted sign selection signal occurs within one-fourth of a period offset from a falling edge of the negative data signal.

4. The electronic device of claim 3, wherein the transition of the first adjusted sign selection signal occurs when the positive data signal is the second value.

5. The electronic device of claim 3, wherein the transition of the second adjusted sign selection signal occurs when the negative data signal is the second value.

6. The electronic device of claim 1, wherein the plurality of signed values stored in the digital-to-analog converter comprise an indication of at least one of: a positive in-phase signal, a negative in-phase signal, a positive quadrature signal, or a negative quadrature signal.

7. The electronic device of claim 1, wherein the digital-to-analog converter comprises a plurality of storage cells in which the plurality of signed values are stored.

8. The electronic device of claim 7, wherein the digital-to-analog converter comprises cell circuitry coupled to each storage cell of the plurality of storage cells, the cell circuitry configured to determine a particular signed value of the plurality of signed values to be stored in a respective storage cell of the plurality of storage cells based on the first adjusted sign selection signal and the second adjusted sign selection signal.

9. A method, comprising:
receiving, via processing circuitry, an input signal comprising in-phase and quadrature component signals;
generating, via the processing circuitry, a positive data signal and a negative data signal based on the input signal;
generating, via the processing circuitry, a sign selection signal based on the input signal;
generating, via the processing circuitry, a first adjusted sign selection signal based on the sign selection signal and associated with the positive data signal, wherein a transition of the first adjusted sign selection signal between a first value and a second value occurs within one-fourth of a period of the positive data signal offset from a rising edge of the positive data signal;
generating, via the processing circuitry, a second adjusted sign selection signal based on the sign selection signal and associated with the negative data signal, wherein a transition of the second adjusted sign selection signal between the first value and the second value occurs within one-fourth of a period of the negative data signal offset from a falling edge of the negative data signal; and
applying, via the processing circuitry, one of the first adjusted sign selection signal or the second adjusted sign selection signal to one or more storage cells of a digital-to-analog converter to change a polarity of a signed value stored therein.

10. The method of claim 9, comprising aggregating, via the processing circuitry, a plurality of signed values stored in the digital-to-analog converter to generate an output signal of a transmitter.

11. The method of claim 10, wherein the first adjusted sign selection signal and the second adjusted sign selection signal reduce an occurrence of an error pulse in the output signal of the transmitter.

12. The method of claim 9, wherein the transition of the first adjusted sign selection signal occurs before the rising edge of the positive data signal.

13. The method of claim 9, wherein the transition of the second adjusted sign selection signal occurs after the falling edge of the negative data signal.

14. The method of claim 9, wherein the signed value comprises an indication of at least one of: a positive in-phase signal, a negative in-phase signal, a positive quadrature signal, or a negative quadrature signal.

15. An electronic device, comprising:
one or more antennas; and
transmit circuitry configured to send a transmission signal to the one or more antennas, the transmit circuitry comprising:
a digital front end configured to receive an input signal and generate a first data signal and a second data signal based on the input signal;
a digital-to-analog converter configured to store one or more signed values and configured to generate the transmission signal; and
signal selection circuitry operatively coupled to the digital front end and the digital-to-analog converter, the signal selection circuitry configured to:
receive the first data signal and the second data signal and a sign selection signal;
generate a positive data signal and a negative data signal for each of the first data signal and the second data signal;
generate a first adjusted sign selection signal based on the sign selection signal and associated with the positive data signal, a transition of the first adjusted sign selection signal being between a first value and a second value;
generate a second adjusted sign selection signal based on the sign selection signal and associated with the negative data signal, a transition of the second adjusted sign selection signal being between the first value and the second value; and
transmit the first adjusted sign selection signal and the second adjusted sign selection signal to the digital-to-analog converter to change a polarity of at least one of the one or more signed values.

16. The electronic device of claim 15, wherein the second value is less than the first value.

17. The electronic device of claim 15, wherein the digital-to-analog converter comprises a plurality of storage cells in which the one or more signed values are stored.

18. The electronic device of claim 17, wherein the digital-to-analog converter comprises cell circuitry coupled to each storage cell of the plurality of storage cells, the cell circuitry configured to determine a particular signed value of the one or more signed values to be stored in a respective cell of the plurality of storage cells based on the first adjusted sign selection signal and the second adjusted sign selection signal.

19. The electronic device of claim 15, wherein the transition of the first adjusted sign selection signal occurs before a rising edge of a respective positive data signal, and wherein the transition of the second adjusted sign selection signal occurs after a falling edge of a respective negative data signal.

20. The electronic device of claim 15, wherein the one or more signed values comprise an indication of at least one of: a positive in-phase signal, a negative in-phase signal, a positive quadrature signal, or a negative quadrature signal.

* * * * *